US012626665B2

(12) United States Patent
Choi et al.

(10) Patent No.: US 12,626,665 B2
(45) Date of Patent: May 12, 2026

(54) DISPLAY DEVICE HAVING A PLURALITY OF SUB-PIXELS FOR OUTPUTTING DIFFERENT VIEWING ANGLE

(71) Applicant: LG Display Co., Ltd., Seoul (KR)

(72) Inventors: Yoonji Choi, Paju-si (KR); Haksu Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/927,086

(22) Filed: Oct. 25, 2024

(65) Prior Publication Data

US 2025/0140199 A1 May 1, 2025

(30) Foreign Application Priority Data

Oct. 27, 2023 (KR) ........................ 10-2023-0145871

(51) Int. Cl.
| | |
|---|---|
| *G09G 3/3258* | (2016.01) |
| *G09G 3/3266* | (2016.01) |
| *G09G 3/3275* | (2016.01) |
| *H10K 59/122* | (2023.01) |
| *H10K 59/123* | (2023.01) |
| *H10K 59/127* | (2023.01) |
| *H10K 59/80* | (2023.01) |

(52) U.S. Cl.
CPC ......... *G09G 3/3258* (2013.01); *G09G 3/3266* (2013.01); *G09G 3/3275* (2013.01); *H10K 59/122* (2023.02); *H10K 59/123* (2023.02); *H10K 59/127* (2023.02); *H10K 59/80518* (2023.02); *H10K 59/80524* (2023.02); *H10K 59/873* (2023.02); *H10K 59/879* (2023.02); *G09G 2300/0443* (2013.01); *G09G 2300/0809* (2013.01)

(58) Field of Classification Search
CPC .................................................... G09G 3/3258
USPC ............................................................ 345/55
See application file for complete search history.

(56) References Cited

U.S. PATENT DOCUMENTS

| | | | | |
|---|---|---|---|---|
| 2012/0133683 A1* | 5/2012 | Goden | ................. | G09G 3/3233 |
| | | | | 345/77 |
| 2022/0399529 A1* | 12/2022 | Shin | ...................... | G09G 3/3275 |
| 2023/0217763 A1* | 7/2023 | Hong | ................... | G09G 3/3258 |

FOREIGN PATENT DOCUMENTS

| | | |
|---|---|---|
| CN | 107170408 B | 5/2019 |
| KR | 10-2022-0165958 A | 12/2022 |

\* cited by examiner

*Primary Examiner* — Long D Pham
(74) *Attorney, Agent, or Firm* — Birch, Stewart, Kolasch & Birch, LLP

(57) ABSTRACT

A display device can include a first mode sub-pixel having a first viewing angle and including a first emitting element, a second mode sub-pixel having a second viewing angle and including a second emitting element, a driving transistor connected to the first emitting element or the second emitting element, a first control transistor configured to connect the first emitting element to the driving transistor by being controlled by a mode selecting signal, a second control transistor configured to connect the second emitting element to the driving transistor by being controlled by the mode selecting signal, and a mode control line configured to apply the mode selection signal to the first switching transistor and the second switching transistor. The first control transistor and the second control transistor are applied with the mode selection signal from the same mode control line.

19 Claims, 13 Drawing Sheets

DISPLAY DEVICE HAVING A PLURALITY OF SUB-PIXELS FOR OUTPUTTING DIFFERENT VIEWING ANGLE

CROSS-REFERENCE TO RELATED APPLICATIONS

This application claims priority to Korean Patent Applications No. 10-2023-0145871 filed in the Republic of Korea on Oct. 27, 2023, the entire contents of which is hereby expressly incorporated by reference into the present application.

BACKGROUND

Field of the Invention

The present disclosure relates to a display device capable of controlling a viewing angle.

Discussion of the Related Art

Recently, there has been a problem of information leakage to third parties through image information displayed on a display device. To solve this problem, security films are being developed to provide image information only to specific people located in front of the display device.

By attaching a security film to the display device, a user can prevent a nearby third party from viewing the image information displayed on the display device. On the other hand, by removing the security film from the display device, the user can allow a nearby third party to see the image information displayed on the display device. As a result, the user has inconvenience of having to carry and manage the security films separately, so that it can be difficult to partially obscure or provide image information to the third party.

SUMMARY OF THE DISCLOSURE

The present disclosure is to provide a display device capable of controlling a viewing angle without a security film.

The present disclosure is to provide a display device capable of partially controlling a viewing angle within a display area.

The present disclosure provides a display device which addresses the limitations and disadvantages associated with the related art.

The present disclosure is to provide a display device capable of implementing Environmental/Social/Governance (ESG) by reducing the generation of greenhouse gases that can be generated by a manufacturing process.

The technical benefits of the present disclosure are not limited to the above-mentioned benefits, and other benefits, which are not mentioned above, can be clearly understood by those skilled in the art from the following descriptions.

A display device according to an embodiment of the present disclosure comprises a first mode sub-pixel having a first viewing angle and including a first emitting element; a second mode sub-pixel having a second viewing angle and including a second emitting element; a driving transistor connected to the first emitting element or the second emitting element; a first control transistor connecting the first emitting element to the driving transistor by being controlled by a mode selecting signal; a second control transistor connecting the second emitting element to the driving transistor by being controlled by the mode selecting signal; and a mode control line applying the mode selection signal to the first switching transistor and the second switching transistor, wherein the first control transistor and the second control transistor are applied with the mode selection signal from the same mode control line.

A display device according to another embodiment of the present disclosure comprises a display panel comprising a plurality of display areas, a pad area, and a plurality of mode control lines disposed in the each of the plurality of display areas to extend to the pad area, the plurality of display areas having a plurality of sub-pixels respectively, wherein the plurality of mode control lines correspond one-to-one to the plurality of display areas, and each of the plurality of mode control line applies a mode selection signal to the plurality of sub-pixels provided in the corresponding display area.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIG. 10 is a schematic illustration of a configuration of a display device according to one embodiment of the present disclosure.

FIG. 11 is a diagram illustrating a driving method of a display device according to one embodiment of the present disclosure.

FIG. 12 is a diagram illustrating another example of a plurality of display areas with independently controllable viewing angles in a display device according to one embodiment of the present disclosure.

FIG. 13 is a diagram illustrating another example of a plurality of display areas with independently controllable viewing angles in a display device according to one embodiment of the present disclosure.

FIG. 14 is a diagram illustrating another example of a plurality of display areas with independently controllable viewing angles in a display device according to one embodiment of the present disclosure.

DETAILED DESCRIPTION OF THE EMBODIMENTS

Figure 1:
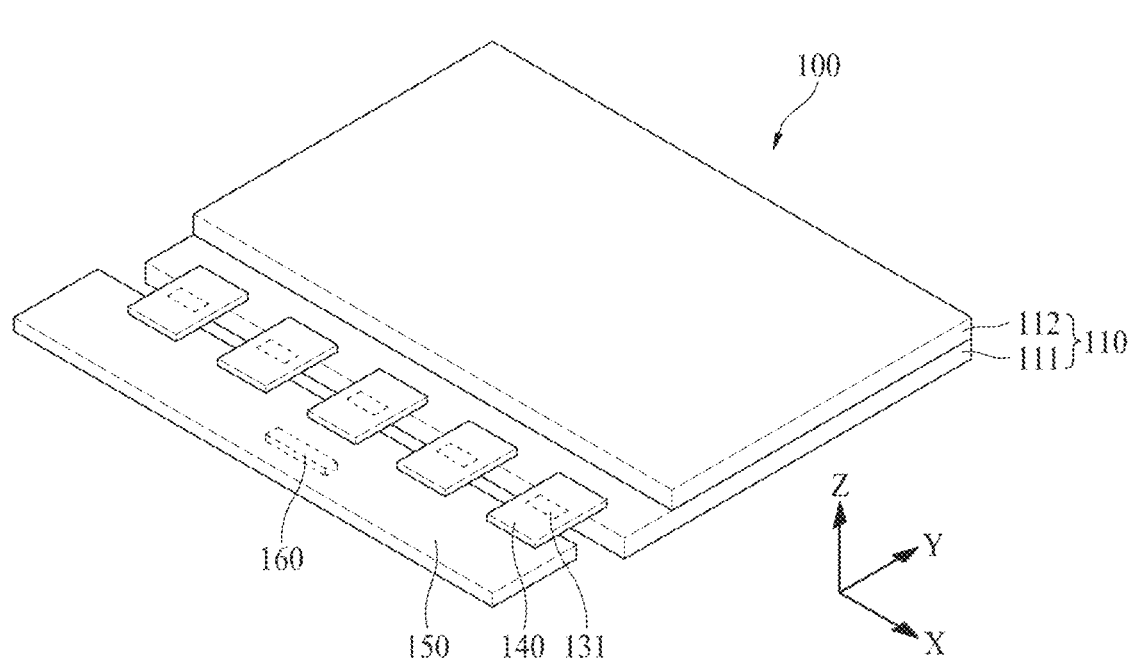
FIG. 1 is a perspective view illustrating a display device according to one embodiment of the present disclosure.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present disclosure are used, another part can be added unless 'only-' is used. The terms of a singular form can include plural forms unless referred to the contrary.

In construing an element, the element is construed as including an error range although there is no explicit description.

In describing a position relationship, for example, when a position relation between two parts is described as 'on', 'over', 'under', and 'next', one or more other parts can be disposed between the two parts unless 'just' or 'direct' is used.

In describing a time relationship, for example, when the temporal order is described as 'after', 'subsequent', 'next', and 'before', a case which is not continuous can be included unless 'just' or 'direct' is used.

It will be understood that, although the terms "first", "second", etc. can be used herein to describe various elements, these elements should not be limited by these terms. These terms are only used to distinguish one element from another, and may not define order or sequence. Accordingly, a first element mentioned hereinafter could be termed a second element without departing from the scope of the present disclosure.

The term "at least one" should be understood as including any and all combinations of one or more of the associated listed items. For example, the meaning of "at least one of a first item, a second item, and a third item" denotes each of the first item, the second item, and the third item as well as the combination of all items proposed from two or more of the first item, the second item, and the third item. Further, the term "can" fully encompasses all the meanings and coverages of the term "may."

Features of various embodiments of the present disclosure can be partially or overall coupled to or combined with each other and can be variously inter-operated with each other and driven technically as those skilled in the art can sufficiently understand. The embodiments of the present disclosure can be carried out independently from each other, or can be carried out together in co-dependent relationship.

Hereinafter, preferred examples of transparent display device according to the present disclosure will be described in detail with reference to the accompanying drawings. In assigning reference numerals to the components in each drawing, the same component can have the same numeral as far as possible, even if shown in different drawings. In addition, in describing the present disclosure, specific descriptions of related disclosed configurations or features can be omitted if it is determined that such detailed description would obscure the spirit of the present disclosure.

Hereinafter, example embodiments of the present disclosure will be described in detail with reference to the accompanying drawings. All the components of each display device according to all embodiments of the present disclosure are operatively coupled and configured.

Figure 2:
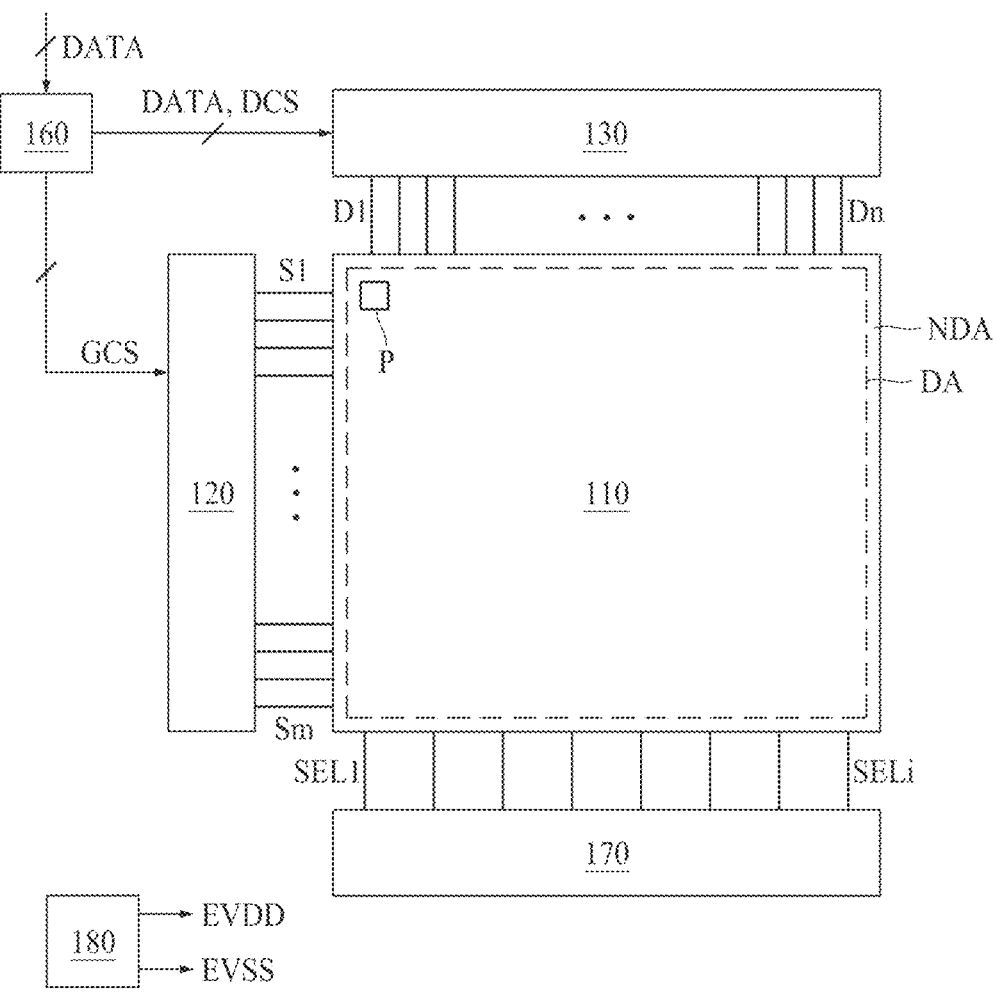
FIG. 2 is a block diagram schematically illustrating a configuration of a display device according to one embodiment of the present disclosure.
Figure 3:
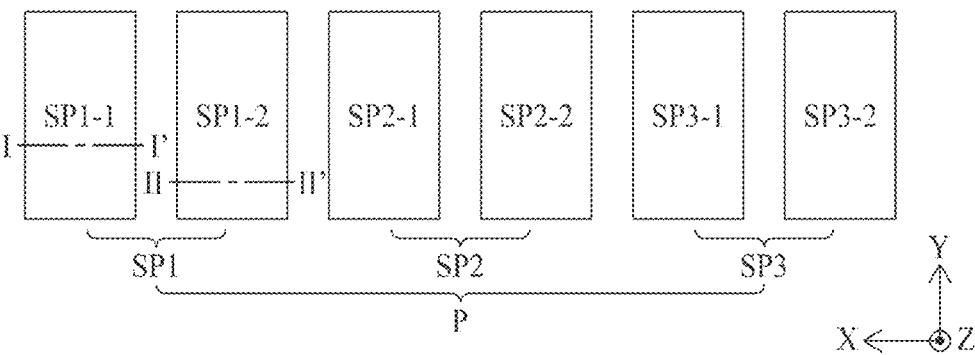
FIG. 3 is a plan view illustrating one example of a pixel in a display device according to one embodiment of the present disclosure.

FIG. 1 is a perspective view illustrating a display device according to one embodiment of the present disclosure and FIG. 2 is a block diagram schematically illustrating a configuration of a display device according to one embodiment of the present disclosure. FIG. 3 is a plan view illustrating one example of a pixel in a display device according to one embodiment of the present disclosure.

While the display device 100 according to one embodiment of the present disclosure has been described with emphasis on its implementation as an Organic Light Emitting Display, it can also be implemented as a Liquid Crystal Display, a Quantum dot Lighting Emitting Diode, or an Electrophoresis display.

Referring to FIGS. 1 and 2, the display device 100 according to one embodiment of the present disclosure includes a display panel 110, a scan driver 120 embedded in the display panel 110, a data driver 130 connected to the display panel 110, a timing controller 160 controlling the scan driver 120 and the data driver 130, a viewing angle control circuit 170, and a power circuit 180.

The display panel 110 includes a first substrate 111 and a second substrate 112. The second substrate 112 can be an encapsulation substrate. The first substrate 111 can be a plastic film or a glass substrate but is not necessarily limited to. The first substrate 111 can also be made of a semiconductor material, such as a silicon wafer. The second substrate 112 can be a plastic film, a glass substrate, or an encapsulation film (or protective film).

The display device 100 according to one embodiment of the present disclosure can emit light in a so-called top emission type in which the emitted light is emitted upwardly but is not necessarily limited thereto. When the display device 100 emits light in a top emission type, the material of the first substrate 111 can include an opaque material as well as a transparent material. When the display device 100 emits light in a bottom emission type in which the emitted light is emitted downwardly, the material of the first substrate 111 can include a transparent material. Hereinafter, for convenience of explanation, it is assumed that the display device 100 emits light in the top emission type, but is not necessarily limited thereto.

The display panel 110 includes a display area DA and a non-display area NDA surrounding the display area DA and disposed at peripheral thereof. The display panel 110 includes pixels P disposed in the display area DA to display images.

Each of the pixels P can include a plurality of sub-pixels SP1, SP2, and SP3, as shown in FIG. 3. The plurality of sub-pixels SP1, SP2, and SP3 can comprise a first sub-pixel SP1 emitting red light, a second sub-pixel SP2 emitting green light, and a third sub-pixel SP3 emitting blue light, but are not necessarily limited to. The plurality of sub-pixels SP1, SP2, and SP3 can be further comprises a fourth sub-pixel emitting white light. Further, the arrangement order of the sub-pixels SP1, SP2, and SP3 can be varied.

Data lines (D1 to Dn, where n is a positive integer greater than or equal to 2) and scan lines (S1 to Sm, where m is a positive integer greater than or equal to 2) are disposed in the display panel 110. The data lines (D1 to Dn) and the scan lines (S1 to Sm) are connected to the sub-pixels SP1, SP2, and SP3. The data lines D1 to Dn can be disposed to intersect with the scan lines S1-Sm. Each of the sub-pixels SP1, SP2, and SP3 of the display panel 110 can be connected to any one of the data lines D1 to Dn and any one of the scan lines S1 to Sm. The data lines D1 to Dn can supply a data voltage supplied from the data driver 130 to each of the sub-pixels SP1, SP2, and SP3. The scan lines S1 to Sm can supply a scan signal supplied from the scan driver 120 to each of the sub-pixels SP1, SP2, and SP3.

When each of the sub-pixels SP1, SP2, and SP3 can be turned on by the scan signal and the data voltage of the data line is supplied to the gate electrode of the driving transistor, the emitting element can emit according to the drain-to-source current of the driving transistor.

The scan driver 120 receives a scan control signal GCS from the timing controller 160. The scan driver 120 can supply scan signals or emitting control signals to the scan lines S1 to Sm using the scan control signal GCS.

The scan driver 120 can be formed on the non-display area NDA outside one or both sides of the display area DA in a gate driver in panel GIP type. Alternatively, the scan driver 120 can be manufactured as a driving chip, mounted on a flexible film, and attached to the non-display area NDA on one or both outer sides of the display area DA in a TAB (tape automated bonding) type.

The data driver 130 receives digital video data DATA and a data control signal DCS from the timing controller 160. The data driver 130 converts the digital video data DATA to analog positive/negative data voltages using the data control signals DCS and supplies them to the data lines D1-Dn.

The data driver 130 can include a plurality of data driver ICs 131 as shown in FIG. 1. Each of the plurality of data driver ICs 131 can be mounted on a circuit film 140 in a chip on film COF type, chip on plastic COP type, flexible printed circuit FPC type, or flexible flat cable FFC type. The circuit film 140 can be attached to pads disposed in the non-display area NDA of the display panel 110 using an anisotropic conducting film, such that the plurality of data driver ICs 131 can be connected to the pads.

The circuit board 150 can be attached to the circuit film 140. In the circuit board 150, a plurality of circuits implemented as driving chips can be mounted. For example, in the circuit board 150, a timing controller 160 can be mounted. The circuit board 150 can be a printed circuit board or a flexible printed circuit board.

The timing controller 160 receives digital video data DATA and timing signals from the host system. The timing signals can include a vertical synchronization signal, a horizontal synchronization signal, a data enable signal, a dot clock, and the like. The vertical synchronization signal is a signal that defines the duration of one frame. A horizontal synchronization signal is a signal that defines a period of one horizontal period required to supply data voltages to the pixels of one horizontal line of the display panel DIS. The Data Enable signal defines the period in which valid data is input. The dot clock is a signal that repeats at a predetermined short interval.

The timing controller 160 generates the data control signal DCS for controlling the timing of operation of the data driver 130 and the scan control signal GCS for controlling the timing of operation of the scan driver 120 based on the timing signals. The timing controller 160 outputs the scan control signal GCS to the scan driver 120, and outputs the digital video data DATA and the data control signal DCS to the data driver 130.

The power circuit 180 can generate and supply a plurality of driving voltages required for operation of all circuit elements of the display device 100 using utilize the input voltage. The power circuit 180 can generate and supply a first power voltage EVDD, a second power voltage EVSS, and an initialization voltage Vref (or a reference voltage) to the display panel 110. The power circuit 180 can generate and supply various driving voltages required for operation of the scan driver 120, the data driver 130, the timing controller 140, and the viewing angle control circuit 170.

On the other hand, the display panel 110 according to one embodiment can control the viewing angle of each sub-pixel SP1, SP2, and SP3 using mode selection signals supplied through mode control lines SEL1 to SELi. Specifically, each sub-pixel SP1, SP2, and SP3 can include two or more sub-pixels with different viewing angles. Each of the sub-pixels SP1, SP2, and SP3, as shown in FIG. 3, can include a first mode sub-pixel SP1-1, SP2-1, and SP3-1 and a second mode sub-pixel SP1-2, SP2-2, and SP3-2. The first mode sub-pixels SP1-1, SP2-1, and SP3-1 can have a first viewing angle and include a first emitting element. The second mode sub-pixels SP1-2, SP2-2, and SP3-2 can have a second viewing angle and include a second emitting element. The first viewing angle and the second viewing angle can be different in at least one of a direction and an angular range. In one example, the second viewing angle can have a smaller angular range than the first viewing angle. As another example, the first viewing angle can be 60 degrees to the left from a frontal 0 degree, and the second viewing angle can be 60 degrees to the right from the frontal 0 degree.

Each sub-pixel SP1, SP2, and SP3 can selectively drive one of the first emitting element and the second emitting element to control a viewing angle. In one example, each sub-pixel SP1, SP2, and SP3 can implement a first viewing angle mode by driving the first emitting element of the first mode sub-pixel SP1-1, SP2-1, and SP3-1. In one embodiment, the first viewing angle mode can be a wide viewing angle mode or a share mode. In another example, each sub-pixel SP1, SP2, and SP3 can implement the second viewing angle mode by driving the second emitting element of the second mode sub-pixel SP1-2, SP2-2, and SP3-2. In one embodiment, the second viewing angle mode can be a narrow viewing angle mode or a privacy mode that limits the angular range of the viewing angle to a smaller extent than the first viewing angle mode.

The viewing angle control circuit 170 can receive a mode control signal from the timing controller 160. The viewing angle control circuit 170 can output the mode selection signal to each of the mode control lines SEL1 to SELi according to the mode control signal.

The display panel 110 can control the viewing angle of each sub-pixel SP1, SP2, and SP3 by selectively driving the first emitting element and the second emitting element of each sub-pixel SP1, SP2, and SP3 using the mode selection signal supplied through the mode control lines SEL1 to SELi. Furthermore, the display panel 110 can divide the display area DA into a plurality of areas and arrange the mode control lines SEL1 to SELi in each of the plurality of areas, and thus independently control the viewing angle of each of the plurality of areas. The detailed description will be described later.

Figure 4:
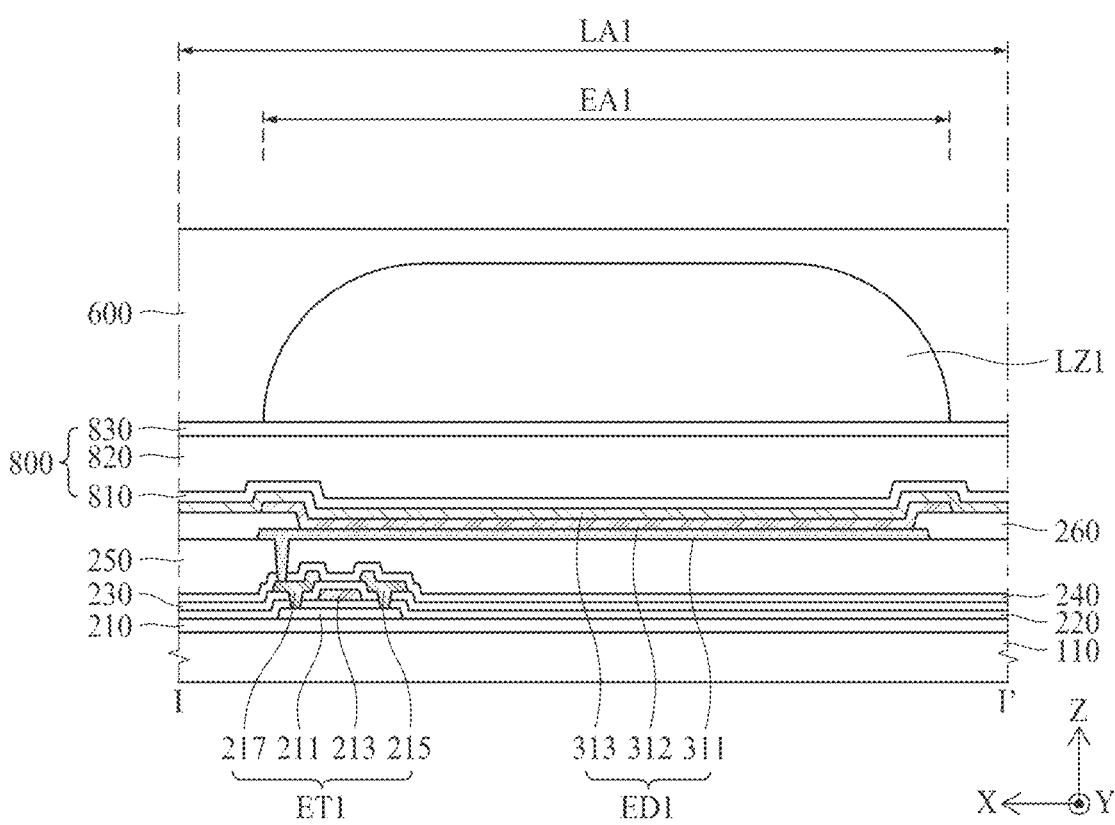
FIG. 4 is a cross-sectional view illustrating one example of a first mode sub-pixel along line I-I' illustrated in FIG. 3.
Figure 5:
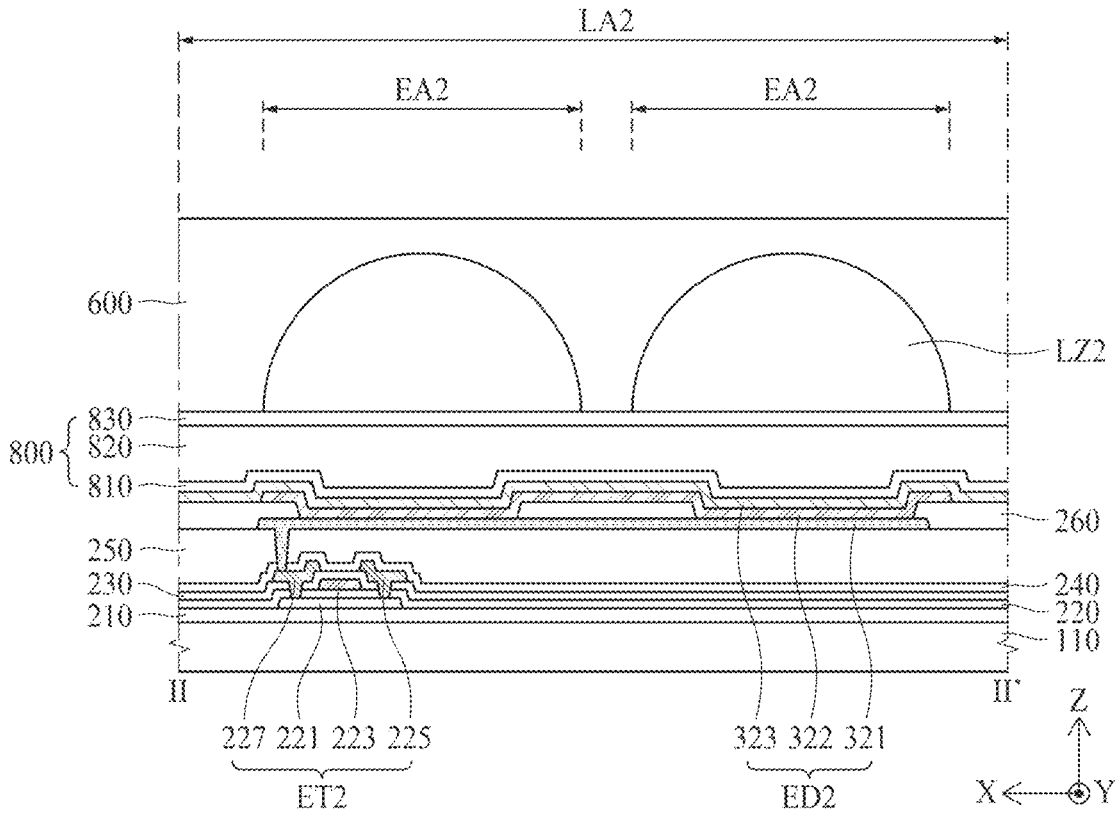
FIG. 5 is a cross-sectional view illustrating one example of a second mode sub-pixel along line II-II' illustrated in FIG. 3.

FIG. 4 is a cross-sectional view illustrating one example of a first mode sub-pixel along line I-I' illustrated in FIG. 3 and FIG. 5 is a cross-sectional view illustrating one example of a second mode sub-pixel along line II-II' illustrated in FIG. 3.

Each of the sub-pixels SP1, SP2, and SP3 disposed in the display panel 110 according to one embodiment of the present disclosure includes the first mode sub-pixel SP1-1, SP2-1, and SP3-1 and the second mode sub-pixel SP1-2, SP2-2, and SP3-2 having different viewing angles each other. There are various ways to implement different viewing angles of the first mode sub-pixels SP1-1, SP2-1, and SP3-1 and the second mode sub-pixels SP1-2, SP2-2, and SP3-2. In one example, the first mode sub-pixels SP1-1, SP2-1, and SP3-1 and the second mode sub-pixels SP1-2, SP2-2, and SP3-2 with different viewing angles can be implemented using the lenses LZ1 and LZ2, as shown in FIGS. 4 and 5.

Referring to FIGS. 4 and 5, the display panel 110 according to one embodiment includes the first substrate 111 a circuit element layer including transistors ET1 and ET2 disposed on the first substrate 111, an emitting element layer including emitting elements ED1 and ED2 disposed on the circuit element layer, an encapsulation layer 800 disposed on the emitting element layer, and a lens layer including lenses LZ1 and LZ2 disposed on the encapsulation layer 800. The display panel 110 according to one embodiment can further include a touch sensor layer disposed between the encapsulation layer 800 and the lens layer. The display panel 110 according to one embodiment can further include a color filter layer comprising a color filter and a black matrix disposed between the touch sensor layer and the lens layer.

Each sub-pixel SP1, SP2, and SP3 can include a first lens area LA1 illustrated in FIG. 4 and a second lens area LA2 illustrated in FIG. 5.

Referring to FIG. 4, the first lens area LA1 can include a first control transistor ET1 of the pixel circuit, a first emitting element ED1 connected to the first control transistor ET1, and a first lens LZ1 disposed to overlap the first light emitting area EA1 on the first emitting element ED1.

Referring to FIG. 5, the second lens area LA2 can include a second control transistor ET2 of the pixel circuit, a second emitting element ED2 connected to the second control transistor ET2, and a plurality of second lenses LZ2 disposed to overlap a plurality of second light emitting areas EA2 on the second emitting element ED2, respectively.

In the display panel 110 according to one embodiment, the circuit element layer disposed on the first substrate 110 can include a plurality of insulating layers stacked on the first substrate 110. For example, the plurality of insulating layers can include a buffer layer 210, a gate insulating layer 220, an interlayer insulating layer 230, a protection layer 240, and a planarization layer 250.

The first substrate 111 can include an insulating material such as glass or plastic. The plastic substrate can be formed of a flexible material. For example, the first substrate 111 can include an organic insulating material of at least one of an acrylic-based resin, an epoxy-based resin, a siloxane-based resin, a polyimide-based resin, and a polyamide-based resin.

The buffer layer 210 can have a single-layer or multi-layer structure comprising an inorganic insulating material such as silicon oxide SiOx, silicon nitride SiNx, or aluminum oxide Al2O3. The buffer layer 210 can prevent hydrogen from flowing into the semiconductor layers 211 and 221 through the first substrate 110.

The control transistors ET1 and ET2 can be disposed on the buffer layer 210.

The first control transistor ET1 includes a semiconductor layer 211, a gate electrode 213, a source electrode 215, and a drain electrode 217 disposed on the buffer layer 210. The second control transistor ET2 includes a semiconductor layer 221, a gate electrode 223, a source electrode 225, and a drain electrode 227 disposed on the buffer layer 210. A gate insulating layer 110 can be disposed between the semiconductor layers 211 and 221 and the gate electrodes 213 and 223. An interlayer insulating layer 230 can be disposed between the gate electrodes 213 and 223 and the source and drain electrodes 215, 217, 225, and 227. Each of the source electrode 215 and the drain electrode 217 of the first control transistor ET1 can be connected with the source area and the drain area of the semiconductor layer 211, respectively, through each contact holes penetrating the interlayer insulating layer 230 and the gate insulating layer 110. Each of the source electrode 225 and the drain electrode 227 of the second control transistor ET2 can be connected with the source area and the drain area of the semiconductor layer 221, respectively, through each contact holes penetrating the interlayer insulating layer 230 and the gate insulating layer 110.

The semiconductor layers 211 and 221 can include polycrystalline silicon, or can comprise an oxide semiconductor material. The semiconductor layers 211 and 221 can include low temperature polysilicon LPTS. The semiconductor layers 211 and 221 can include an oxide semiconductor material of at least one of IZO series (InZnO), IGO series (InGaO), ITO series (InSnO), IGZO series (InGaZnO), IGZTO series (InGaZnSnO), GZTO series (GaZnSnO), GZO series (GaZnO), and ITZO series (InSnZnO). A light blocking layer can further be disposed below the semiconductor layers 211 and 221.

The gate insulating layer 220 can include an inorganic insulating material such as silicon oxide SiOx and silicon nitride SiNx. The gate insulating layer 220 can include a material having a high dielectric constant. For example, the gate insulating layer 220 can include a high-K material such as hafnium oxide HfO. The gate insulating layer 220 can have a multi-layer structure.

The gate lines connected with the gate electrodes 213 and 223 can be disposed on the gate insulating layer 220.

The interlayer insulating layer 230 can include an inorganic insulating material such as silicon oxide SiOx and silicon nitride SiNx. The interlayer insulating layer 230 can have a multi-layer structure.

The data lines and the power lines connected to the source electrodes 215 and 225 or the drain electrodes 217 and 227 can be disposed on the interlayer insulating layer 230.

A protection layer 240 and a planarization layer 250 can be stacked on the first and second control transistors ET1 and ET2. The protection layer 240 can include an inorganic insulating material such as silicon oxide SiOx and silicon nitride SiNx. The planarization layer 250 can include an organic insulating material different from the protection layer 240 and provide a planar surface.

The emitting element layer including the first emitting element ED1 and the second emitting element ED2 can be disposed on the planarization layer 250.

The first emitting element ED1 includes a first electrode 311 disposed on the planarization layer 250, a light emitting layer 312 disposed on the first electrode 311, and a second electrode 313 disposed on the light emitting layer 312. The second emitting element ED2 includes a first electrode 321 disposed on the planarization layer 250, a light emitting layer 322 disposed on the first electrode 321, and a second electrode 323 disposed on the light emitting layer 322. The first emitting element ED1 and the second emitting element ED2 disposed in each sub-pixel SP1, SP2, and SP3 can emit light of the same color.

The first electrode 311 of the first emitting element ED1 can be connected to any one of the source electrode 215 and the drain electrode 217 of the first control transistor ET1 through the contact hole penetrating the protection layer 240 and the planarization layer 250. The first electrode 321 of the second emitting element ED2 can be connected with any one of the source electrode 225 and the drain electrode 227 of the second control transistor ET2 through the contact hole penetrating the protection layer 240 and the planarization layer 250.

The first electrodes 311 and 321 can include a conductive material having a high reflectivity. The first electrodes 311 and 321 can include metals such as aluminum Al, silver Ag, titanium Ti, and silver-palladium-copper APC alloys. The first electrodes 311 and 321 can further comprise a transparent conductive material such as indium tin oxide ITO or indium zinc oxide IZO. For example, the first electrodes 311 and 321 can have a multilayer structure (Ti/Al/Ti) of titanium Ti and aluminum Al, a multilayer structure (ITO/Al/ITO) of a multilayer structure of ITO and aluminum Al, or a multilayer structure (ITO/APC/ITO) of ITO and APC.

The light emitting layers 312 and 322 can include an emission material layer EML including an emissive material. The emission material can include an organic material, an inorganic material, or a hybrid material. The light emitting layer 312 of the first emitting element ED1 and the second light emitting layer 322 of the second emitting element ED2 can be spaced apart. Accordingly, light emission by a leakage current can be prevented.

The light emitting layers 312 and 322 can have a multilayer structure. For example, the light emitting layers 312 and 322 can include at least one of a hole injection layer HIL, a hole transport layer HTL, an electron transport layer ETL, and an electron injection layer EIL.

The second electrodes 313 and 323 can include a light-transmissive conductive material. The second electrodes 313 and 323 can include a transparent conductive material such as ITO or IZO. The second electrodes 313 and 323 can include aluminum Al, magnesium Mg, silver Ag, or an alloy thereof, and can have a thin thickness that is light transmissive. Accordingly, light generated by each of the light emitting layers 312 and 322 can be emitted through each of the second electrodes 313 and 323.

The first electrode 311 of the first emitting element ED1 can be spaced apart from the first electrode 321 of the second emitting element ED2, and a bank 160 can be disposed between the first electrodes 311 and 321. The bank 260 can cover an edge of each of the first electrodes 311 and 321. The bank 260 can include an organic insulating material. The bank 260 can include a different organic material from the planarization layer 250, and can have a single- or double-layer structure.

The bank 260 can define the first emission area EA1 by having an opening through which the first electrode 311 is exposed. The light emitting layer 312 and the second electrode 313 of the first emitting element ED1 can be stacked on the first electrode 311 exposed by the opening of the bank 260.

The bank 260 can define a second emission area EA2 by having an opening through which the first electrode 321 of the second emitting element ED2 is exposed. In one embodiment, the bank 260 can define a plurality of second emission areas EA2 by having a plurality of openings on the first electrode 321 of the second emitting element ED2. The light emitting layer 322 and the second electrode 323 of the second emitting element ED2 can be stacked on the first electrode 321 exposed by the openings of the bank 260. The emitting layer 322 and second electrode 323 of the second emitting element ED2 can overlap the first electrode 321 with the bank 260 interposed therebetween. In the second lens area BNE, the plurality of second emitting areas EA2 can be spaced apart by the bank 260 and disposed independently, but can share the first electrode 321, the light emitting layer 322, and the second electrode 323 of the second emitting element ED2. Accordingly, the light emission efficiency of the second light emitting areas EA2 can be improved. The size of the second light-emitting area EA2 can be smaller than the size of the first light-emitting area EA1.

The second electrode 313 of the first emitting element ED1 can be a common electrode electrically connected with the second electrode 323 of the second emitting element ED2.

The encapsulation layer 800 can be disposed on the emitting element layer including the first emitting element ED1 and the second emitting element ED2. The encapsulation layer 800 can prevent damage to the emitting elements ED1 and ED2 by moisture and impact from the outside. The encapsulation layer 800 can have a multi-layer structure. For example, the encapsulation layer 800 can include, but is not limited to, a first encapsulation layer 810, a second encapsulation layer 820, and a third encapsulation layer 830 stacked in sequence. The first encapsulation layer 810, the second encapsulation layer 820, and the third encapsulation layer 830 can include an insulating material. The second encapsulation layer 820 can include a different material from the first encapsulation layer 810 and the third encapsulation layer 830. For example, the first encapsulation layer 810 and the third encapsulation layer 830 can be inorganic encapsulation layers including an inorganic insulating material, and the second encapsulation layer 820 can include an organic encapsulation layer including an organic insulating material. Accordingly, the emitting elements ED1 and ED2 can be more effectively prevented from being damaged by moisture and impact from the outside.

The lens layer including a first lens LZ1 and a second lens LZ2 can be disposed on the encapsulation layer 800.

The first lens LZ1 is disposed on the first emitting element ED1 of the first mode sub-pixel SP1-1, SP2-1, and SP3-1, and can be disposed on the light propagation path of the first emitting element (ED1). The second lens LZ2 is disposed on the second emitting element ED2 of the second mode sub-pixel SP1-2, SP2-2, and SP3-2, and can be disposed on light propagation path of the second emitting element ED2.

In each of the sub-pixels SP1, SP2, and SP3, the second emitting element ED2 can include a plurality of second emitting elements ED2 or the plurality of second emitting areas EA2, and the plurality of second lenses LZ2 can be individually disposed on the plurality of second emitting elements ED2 or the plurality of second emitting areas EA2. In each of the sub-pixels SP1, SP2, and SP3, the plurality of second emitting elements ED2 or the plurality of second emitting areas EA2 can be connected in parallel.

The first lens LZ1 and the second lens LZ2 can differently control (limit) a viewing angle in at least one direction. In one example, the first lens LZ1 and the second lens LZ2 can control (limit) the viewing angle in the first direction (e.g., the X-axis direction) differently and control (limit) the viewing angle in a second direction (e.g., the Y-axis direction) the same.

For example, the first lens LZ1 does not limit the propagation path of light emitted from the first emitting element ED1 to within a certain angle in the first direction (e.g., the X-axis direction), thereby controlling the viewing angle to a wide field of view. The second lens LZ2 can control the viewing angle to a narrow field of view by limiting the propagation path of the light emitted from the second emitting element ED2 to within a certain angle in the first direction (e.g., the X-axis direction).

When the first emitting element ED1 is driven in each of the sub-pixels SP1, SP2, and SP3, the corresponding sub-pixel can operate in the wide viewing angle mode that does not limit the viewing angle in the first direction (e.g., the X-axis direction). When the second emitting element ED2 is driven in each of the sub-pixels SP1, SP2, and SP3, the corresponding sub-pixel can operate in a narrow viewing angle mode that limits the viewing angle in the first direction (e.g., the X-axis direction).

For example, each sub-pixel SP1, SP2, and SP3 can drive the first emitting element ED1 to implement the first viewing angle mode, the wide viewing angle mode, or a share mode through the first lens area LA1. Each of the sub-pixels SP1, SP2, and SP3 can drive the second emitting element ED2 to implement the second viewing angle mode, a narrow viewing angle mode, or a privacy mode that limits a viewing angle smaller than the wide viewing angle mode through the second lens area LA2.

A lens protection layer 600 can be disposed on the first lens LZ1 and the second lens LZ2 of each sub-pixel SP1, SP2, and SP3. The lens protection layer 600 can include an organic insulating material. The refractive index of the lens protection layer 600 can be smaller than the refractive index of the first lens LZ1 and the refractive index of the second lens LZ2. Accordingly, light passing through the first lens LZ1 and the second lens LZ2 cannot be reflected in the direction of the first substrate 110 due to the difference in refractive indices with the lens protection layer 600.

Figure 6:
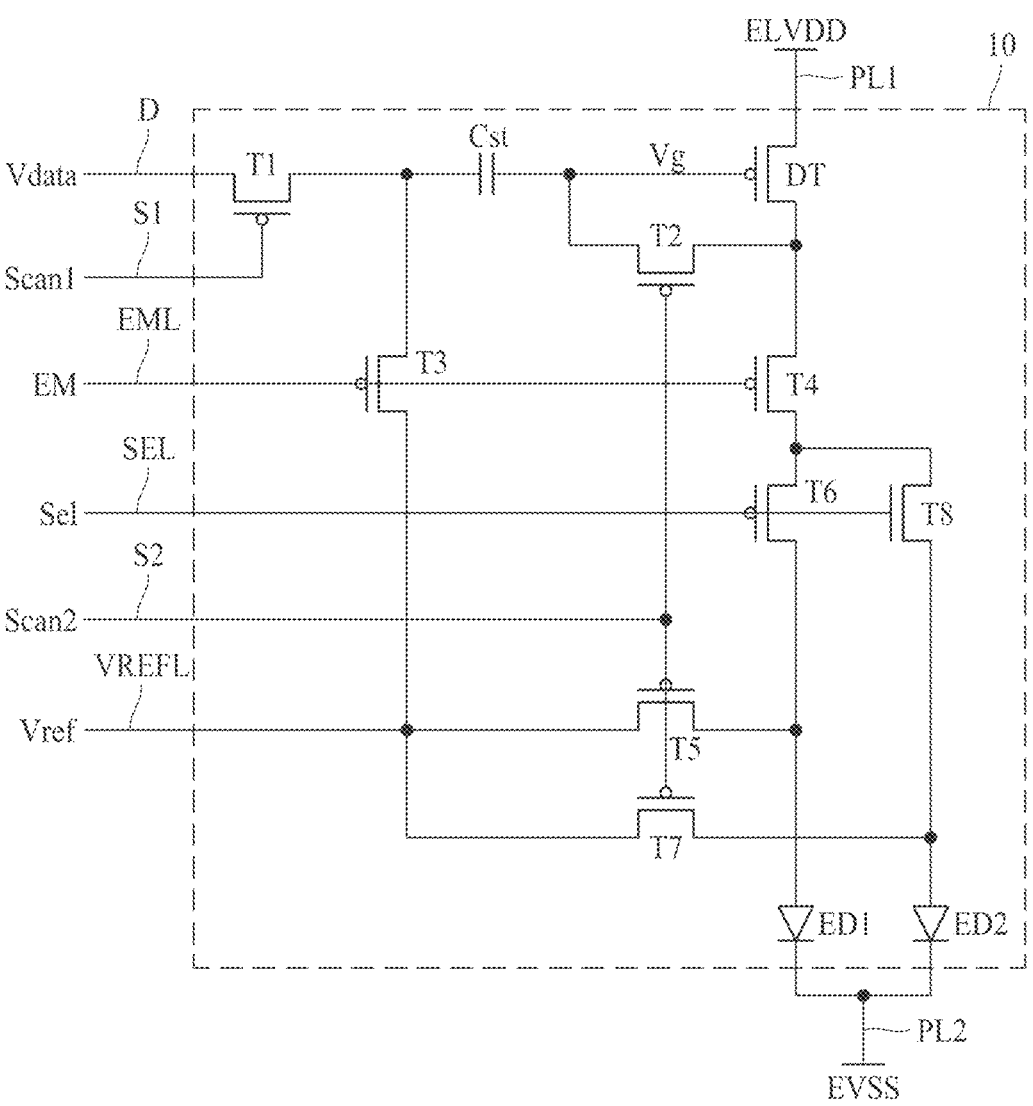
FIG. 6 is an equivalent circuit diagram illustrating the circuit configuration of each sub-pixel in a display panel according to one embodiment of the present disclosure.
Figure 7:
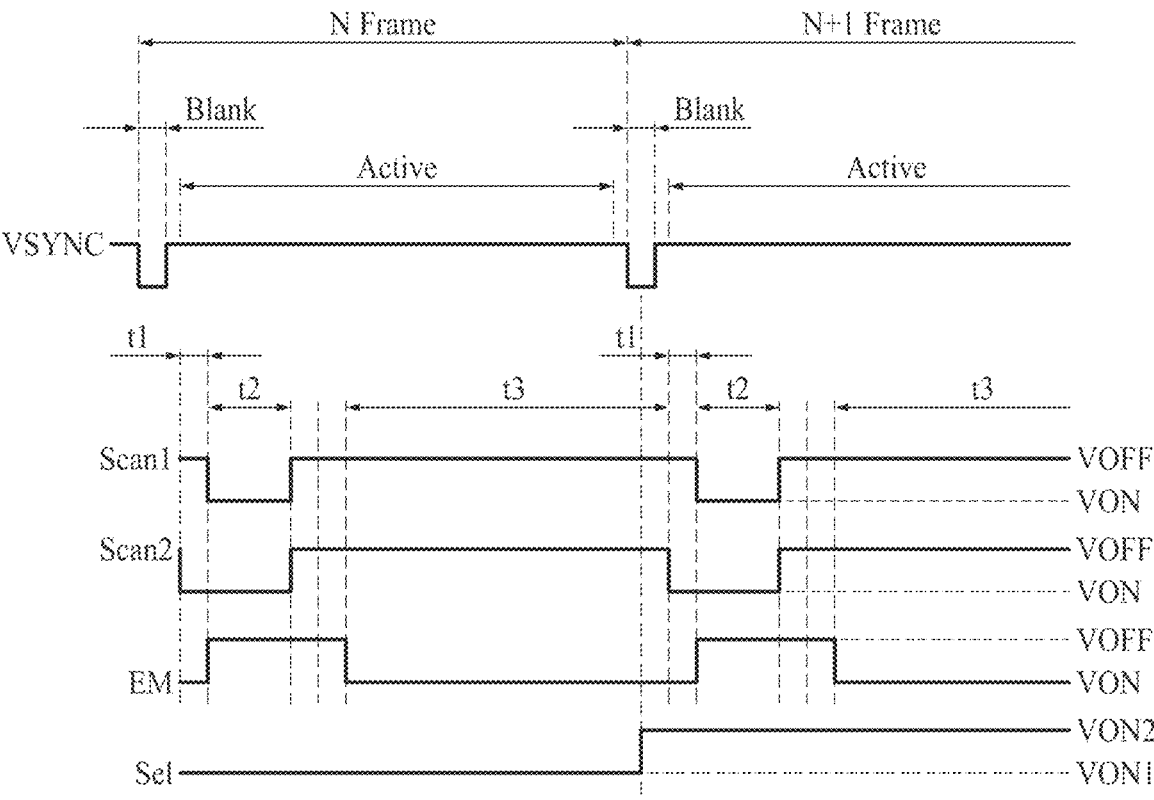
FIG. 7 is an illustration of an example driving waveform for a sub-pixel of a display panel, according to one embodiment of the present disclosure.

FIG. 6 is an equivalent circuit diagram illustrating the circuit configuration of each sub-pixel in a display panel according to one embodiment of the present disclosure, and FIG. 7 is an illustration of an example drive waveform for a sub-pixel of a display panel, according to one embodiment of the present disclosure.

Referring to FIG. 6, each sub-pixel SP1, SP2, and SP3 can include a pixel circuit 10 comprising a plurality of transistors DT, T1 to T8 and first and second emitting elements ED1 and ED2.

The pixel circuit 10, shown in FIG. 6, can include eight switching transistors T1 to T8, a driving transistor DT, the storage capacitor Cst, and the first and second emitting elements ED1 and ED2, and is not limited to this configuration. In FIG. 6, the first control transistor T6 can correspond to the first control transistor ET1 shown in FIG. 4, and the second control transistor T8 can correspond to the second control transistor ET2 shown in FIG. 5.

Referring to FIGS. 6 and 7, the pixel circuit 10 of each sub-pixel SP1, SP2, and SP3 can be driven to include an Initial period t1, a Sampling and Program period t2, and an Emission period t3 for each of the frame periods N and N+1. Each of the frame periods N and N+1 can be separated in synchronization with the vertical synchronization signal VSYNC and can include a blank period and an active period.

The active period can represent a time when image data of a frame is transmitted to the sub-pixels along with a data enable signal, and the blank period can represent a time when image data is not received between the active periods of each of the frames. When dummy sub-pixels are further disposed in the non-display area, a dummy image period for transmitting dummy data to the dummy sub-pixels can be further included before and after the active period.

The first scan signal Scan1 can be activated by a gate-on-voltage VON during the sampling and program period t2 and deactivated by a gate-off-voltage VOFF during the remaining periods.

The second scan signal Scan2 can be activated by the gate-on-voltage VON during the initial period t1 and the sampling and program period t2, and deactivated by the gate-off-voltage VOFF during the remaining periods.

The emitting control signal EM can be activated by the gate-on-voltage VON during the initial period t1 and the emission period t3 and deactivated by the gate-off-voltage VOFF during the remaining periods. From the time when the sampling and program period t2 ends to the time when the emission period t3 begins (or the holding period), the first scan signal Scan1, the second scan signal Scan2, and the emitting control signal EM can all be deactivated by the gate-off-voltage VOFF to maintain the voltage between the gate-source (or drain) of the driving transistor DT. Although FIG. 7 shows a holding period is provided between the sampling and program period t2 and the emission period t3, it is not necessarily limited thereto, and in other embodiments, the holding period may not be provided. In this example, the emitting control signal EM can be activated by the gate-on-voltage VON at the time point at which the sampling and program period t2 ends.

The mode selection signal Sel can be activated with a first gate-on-voltage VON1 when the corresponding sub-pixel is controlled in the first viewing angle mode, the wide viewing angle mode, or the share mode, and activated with a second gate-on-voltage VON2 when the corresponding sub-pixel is controlled in the second viewing angle mode, the narrow viewing angle mode, or the privacy mode. The first gate-on-voltage VON1 can have a lower level than the second gate-on-voltage VON2. The first gate-on-voltage VON1 can be represented as a low voltage, and the second gate-on-voltage VON2 can be expressed as a high voltage. However, this is not necessarily limited. In another embodiment, the first gate-on-voltage VON1 can have a higher level than the second gate-on-voltage VON2. In this example, the first gate-on-voltage VON1 can be represented as a high voltage and the second gate-on-voltage VON2 can be represented as a low voltage.

When the mode of the mode selection signal Sel is switched, the mode selection signal Sel can be switched from the first gate-on-voltage VON1 to the second gate-on-voltage VON2 or from the second gate-on-voltage VON2 to the first gate-on-voltage VON1 in the blank period between the Nth (N is a natural number) frame period and the N+1st frame period, which are separated by the vertical synchronization signal VSYNC.

In each of the sub-pixels SP1, SP2, and SP3, the first emitting element ED1 can be driven using the first control transistor T6 controlled by the mode selection signal Sel. Specifically, when the first control transistor T6 is turned on by the mode selection signal Sel corresponding to the first gate-on-voltage VON1, the first emitting element ED1 can be driven by being connected to the driving transistor DT. The first lens LZ1 disposed in the light propagation direction of the first emitting element ED1 can control the viewing angle to a wide field of view.

The second emitting element ED2 can be driven using the second control transistor T8 controlled by the mode selection signal Sel. Specifically, when the second control transistor T8 is turned on by the mode selection signal Sel corresponding to the second gate-on-voltage VON2, the second emitting element ED2 can be driven by being connected to the driving transistor DT. The second lens LZ2 disposed in the light propagation direction of the second emitting element ED2 can be controlled at a narrow viewing angle.

Each of the transistors DT, T1 to T8 of each sub-pixel SP1, SP2, and SP3 includes a gate electrode, a source electrode, and a drain electrode. Since the source electrode and the drain electrode are not fixed and can change according to the direction of the voltage and current applied to the gate electrode, one of the source electrode and the drain electrode can be represented as the first electrode and the other can be represented as the second electrode. The transistors DT, T1 to T8 of each sub-pixel SP1, SP2, and SP3 can utilize at least one of a polysilicon semiconductor, an amorphous silicon semiconductor, and an oxide semiconductor. The transistors can be P-type, N-type, or a mixture of P-type and N-type.

Each of the emitting elements ED1 and ED2 can include an anode electrode individually connected to each of the control transistors T6 and T8, a cathode electrode supplied with a second power voltage EVSS from the second power line PL, and a light emitting layer between the anode electrode and the cathode electrode. The anode electrode can be an independent electrode for each emitting element, while the cathode electrode can be a common electrode shared by all emitting elements. When a driving current is supplied to each of the emitting elements ED1 and ED2 from the driving transistor DT through each of the control transistors T6 and T8, electrons from the cathode electrode are injected into the light emitting layer, and holes from the anode electrode are injected into the light emitting layer, and the fluorescent or phosphorescent material can be emitted by the recombination of the electrons and holes in the light emitting layer, thereby generating light with a brightness proportional to the current value of the driving current.

The first electrode of the driving transistor DT can be connected to a first power line PL supplying a first power voltage EVDD. The first power voltage EVDD can be supplied from the power circuit 180. The second electrode of the driving transistor DT can be commonly connected to the first electrodes of the first and second control transistors T6 and T8 through the fourth switching transistor T4. The driving transistor DT can drive the first emitting element ED1 through the fourth switching transistor T4 and the first control transistor T6, or can drive the second emitting element ED2 through the fourth switching transistor T4 and the second control transistor T8. The driving transistor DT can control the driving current according to the driving voltage Vg of the storage capacitor Cst. Thereby, the driving transistor DT can control the emission intensity of the first emitting element ED1 through the first control transistor T6, or can control the emission intensity of the second emitting element ED2 through the second control transistor T8.

The storage capacitor Cst can be connected between the gate electrode of the driving transistor DT and the first electrode of the first switching transistor T1 to charge a driving voltage Vg corresponding to the data voltage Vdata. The storage capacitor Cst can hold the charged driving voltage Vg during the emission period t3 in which the first switching transistor T1 is turned off, and supply it to the driving transistor DT.

The first switching transistor T1 can be turned on or turned off in response to the first scan signal Scan1 supplied to the first scan line S1. The first switching transistor T1 can supply a data voltage Vdata supplied through the data line D to the first electrode of the storage capacitor Cst during the sampling and program period t2 in response to the gate-on-voltage VON of the first scan signal Scan1. The first scan signal Scan1 can be supplied from the scan driver 120 as shown in FIG. 2.

The second, fifth, and seventh switching transistors T2, T5, and T7 can be turned on or off in response to the second scan signal Scan2 supplied to the second scan line S2. The second scan signal Scan2 can be supplied from the scan driver 120 as shown in FIG. 2.

The second switching transistor T2 can connect the gate electrode and the second electrode (or drain electrode) of the driving transistor DT during the initial period t1 and the sampling and program period t2 in response to the gate-on-voltage VON of the second scan signal Scan2, so that the driving transistor DT can be connected in a diode structure. The second switching transistor T2 can charge the threshold voltage Vth of the driving transistor DT to the storage capacitor Cst to and compensate the threshold voltage Vth of the driving transistor DT. Accordingly, the storage capacitor Cst can charge a data voltage Vdata+Vth compensated the threshold voltage Vth of the driving transistor DT during the sampling period and the program period t2.

The fifth switching transistor T5 can supply the initialization voltage Vref (or reference voltage) supplied through the initialization voltage line VREFL to the anode electrode of the first emitting element ED1 during the initial period t1 and the sampling and program period t2 in response to the gate-on-voltage VON of the second scan signal Scan2.

The seventh switching transistor T7 can supply the initialization voltage Vref (or reference voltage) supplied through the initialization voltage line VREFL to the anode electrode of the second emitting element ED2 during the initial period t1 and the sampling and program period t2 in response to the gate-on-voltage VON of the second scan signal Scan2.

The third and fourth switching transistors T3 and T4 can be turned on or turned off in response to the emitting control signal EM supplied to the emitting control line EML. The emitting control signal EM can be supplied from the scan driver 120 as shown in FIG. 2.

The third switching transistor T3 can supply the initialization voltage Vref (or reference voltage) supplied through the initialization voltage line VREFL to the first electrode of the storage capacitor Cst during the initial period t1 and the emission period t3 in response to the gate-on-voltage VON of the emitting control signal EM.

The fourth switching transistor T4 can connect the driving transistor DT and the first and second control transistors T6 and T8 during the initial period t1 and the emission period t3 in response to the gate-on-voltage VON of the emitting control signal EM.

The first and second control transistors T6 and T8 can be controlled by the mode selection signal Sel supplied to the mode control line SEL, and can be turned on or turned off. The first and second control transistors T6, T8 can be turned on at different voltages.

The first control transistor T6 is turned on when the mode selection signal Sel is the first gate-on-voltage VON1, and can connect the driving transistor DT and the first emitting element ED1 during the emission period t3 in which the fourth switching transistor T4 is turned on by the emitting control signal EM. Accordingly, the first emitting element ED1 can be driven by the driving current from the driving transistor DT and emit light. The sub-pixels SP1, SP2, and SP3 can emit light at a first viewing angle through the first lens LZ1, and can operate in the first viewing angle mode, the wide viewing angle mode, or the share mode.

On the other hand, when the mode selection signal Sel is the second gate-on-voltage VON2, the first control transistor T6 can be turned off, thus the driving transistor DT and the first emitting element ED1 cannot be connected. The second gate-on-voltage VON2 can correspond to a first gate-off-voltage for turning off the first control transistor T6.

The second control transistor T8 can be turned on when the mode selection signal Sel is the second gate-on-voltage VON2, thereby connecting the driving transistor DT and the second emitting element ED2 during an emission period t3 in which the fourth switching transistor T4 is turned on by the emitting control signal EM. Accordingly, the second emitting element ED2 can be driven by the driving current from the driving transistor DT and emit light. The sub-pixels SP1, SP2, and SP3 can emit light at the second viewing angle through the second lens LZ2, and can operate in the second viewing angle mode, the narrow viewing angle mode, or the privacy mode.

On the other hand, the second control transistor T8 can be turned off when the mode selection signal Sel is the first gate-on-voltage VON1, thus the driving transistor DT and the second emitting element ED2 cannot be connected. The first gate-on-voltage VON1 can correspond to a second gate-off-voltage for turning off the second control transistor T8.

The first and second control transistors T6 and T8 can be implemented with transistors having different characteristics in order to control them to be turned on or turned off at different voltages. One of the first and second control transistors T6 and T8 can be an N-type transistor, and the other can be a P-type transistor.

In one example, the first control transistor T6 can be an N-type transistor and the second control transistor T8 can be a P-type transistor. In this example, when the mode selection signal Sel is a high voltage, the first control transistor T6, which is an N-type transistor, can be turned on, and the second control transistor T8, which is a P-type transistor, can be turned off. The corresponding sub-pixel can operate in the first viewing angle mode, the wide viewing angle mode, or the share mode due to the first emitting element ED1 being emitted. On the other hand, when the mode selection signal Sel is a low voltage, the first control transistor T6, which is an N-type transistor, can be turned off, and the second control transistor T8, which is a P-type transistor, can be turned on. The corresponding sub-pixel can operate in the second viewing angle mode, the narrow viewing angle mode, or the privacy mode due to the second emitting element ED2 being emitted.

In another example, the first control transistor T6 can be a P-type transistor and the second control transistor T8 can be an N-type transistor. In this example, when the mode selection signal Sel is a high voltage, the first control transistor T6, which is a P-type transistor, can be turned off, and the second control transistor T8, which is an N-type transistor, can be turned on. The corresponding sub-pixel can operate in the second viewing angle mode, the narrow viewing angle mode, or the privacy mode due to the second emitting element ED2 being emitting. On the other hand, when the mode selection signal Sel is a low voltage, the first control transistor T6, which is a P-type transistor, can be turned on, and the second control transistor T8, which is an N-type transistor, can be turned off. The corresponding sub-pixel can operate in the first viewing angle mode, the wide viewing angle mode, or the share mode due to the first emitting element ED1 being emitted.

The display panel 110 according to one embodiment of the present disclosure can select a mode of the sub-pixels SP1, SP2, and SP3 between the first viewing angle mode and the second viewing angle mode using one mode selection signal Sel. Each of the sub-pixels SP1, SP2, and SP3 provided in the display panel 110 according to one embodiment of the present disclosure includes the first mode sub-pixel SP1-1, SP2-1, and SP3-1 having the first viewing angle and provided with the first emitting element ED1, and the second mode sub-pixel SP1-2, SP2-2, and SP3-2 having the second viewing angle and provided with the second emitting element ED2.

Each sub-pixel SP1, SP2, and SP3 is capable of emitting only one of the first emitting element ED1 and the second emitting element ED2 by using the mode selecting signal applied through the mode control line SEL. In each sub-pixel SP1, SP2, and SP3, when the first control transistor T6 connected with the first emitting element ED1 can be turned on by the mode selection signal Sel, the first emitting element ED1 and the driving transistor DT are connected, thus the first emitting element ED1 can emit. Meanwhile, in each of the sub-pixels SP1, SP2, and SP3, when the second control transistor T8 connected with the second emitting element ED2 is turned on by the mode selection signal Sel, the second emitting element ED2 and the driving transistor DT are connected, thus the second emitting element ED2 can emit. At this time, each of the sub-pixels SP1, SP2, and SP3 is connected with one mode control line SEL, thus one mode selection signal can be applied. For example, the first control transistor T6 and the second control transistor T8 provided in the same sub-pixel can be applied with the mode selection signal Sel from the same mode control line SEL.

In the display panel 110 according to one embodiment of the present disclosure, by implementing that the first control transistor T6 and the second control transistor T8 are turned on at different voltages, it is possible to control that one of the first control transistor T6 and the second control transistor T8 is selectively turned on even when the same mode selection signal Sel is applied. When the same mode selection signal Sel is applied to the first control transistor T6 and the second control transistor T8 provided in the same sub-pixel, only one of the first control transistor T6 and the second control transistor T8 can be turned on and the other can be turned off depending on the voltage of the mode selection signal Sel. For example, when the mode selection signal Sel is the first gate-on-voltage VON1, the first control transistor T6 can be turned on, and the second control transistor T8 can be turned off. On the other hand, when the mode selection signal Sel is the second gate-on-voltage VON2, the first control transistor T6 can be turned off, and the second control transistor T8 can be turned on.

As described above, the sub-pixels SP1, SP2, and SP3 provided in the display panel 110 according to one embodiment of the present disclosure can use only one mode control line SEL for selecting a viewing angle mode between the first viewing angle mode and the second viewing angle mode. The display panel 110 according to one embodiment of the present disclosure can significantly reduce the number of mode control lines SEL disposed on the display panel 110 when compared to a display panel having a control line for selecting the first viewing angle mode and a control line for selecting the second viewing angle mode, respectively. The display panel 110 according to one embodiment of the present disclosure can implement ESG (Environment/Social/Governance) by reducing production energy and reducing the generation of greenhouse gases due to the reduction in the number of signal lines formed in the display panel 110.

Figure 8:
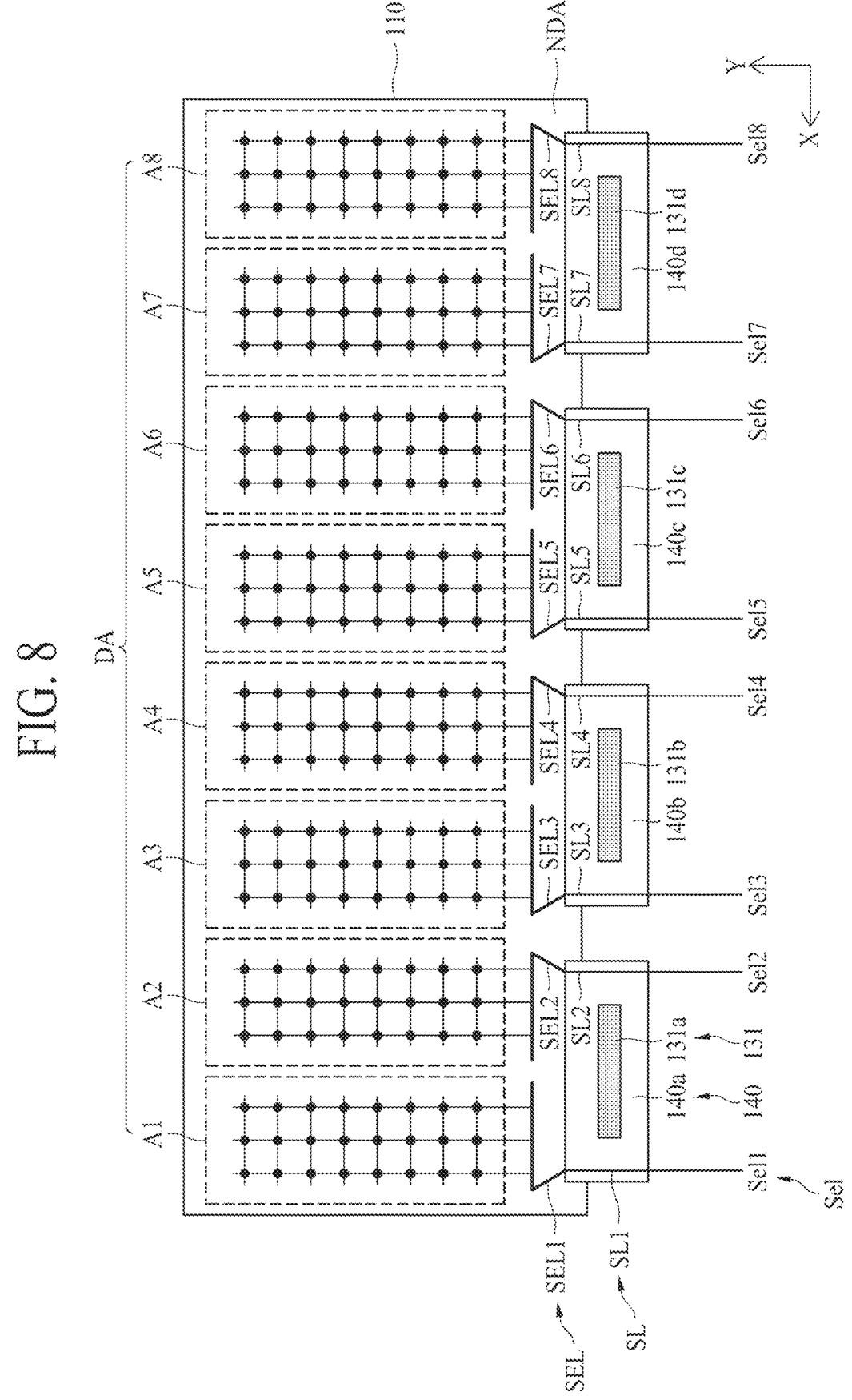
FIG. 8 is a diagram illustrating an example of a plurality of display areas with independently controllable viewing angles in a display device according to one embodiment of the present disclosure.
Figure 9A:
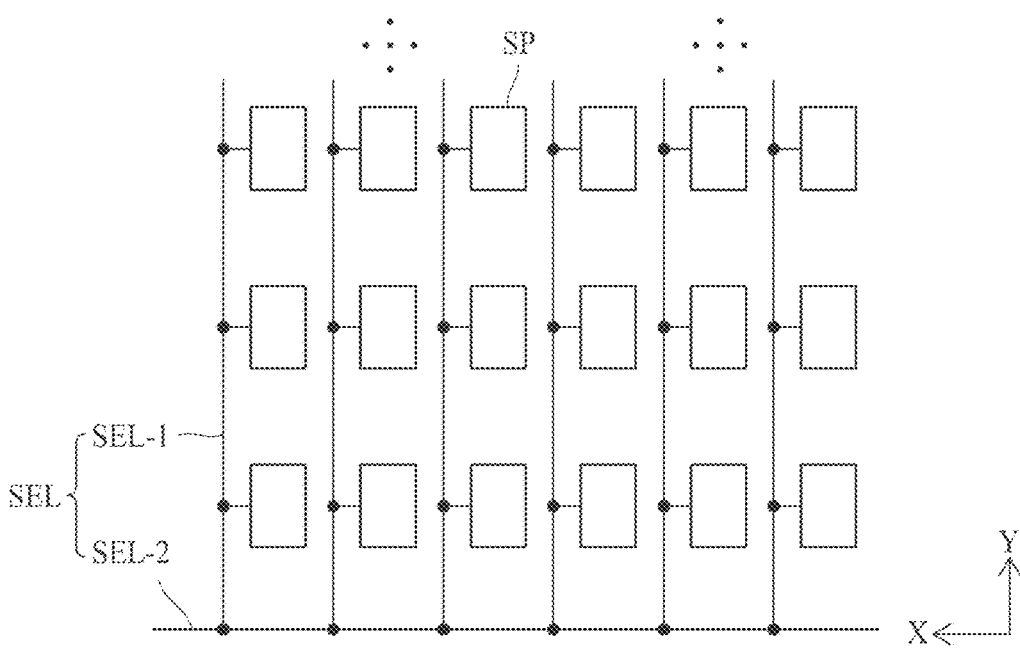
FIG. 9A is a diagram illustrating one example of a connection structure between one mode control line and sub-pixels.
Figure 9B:
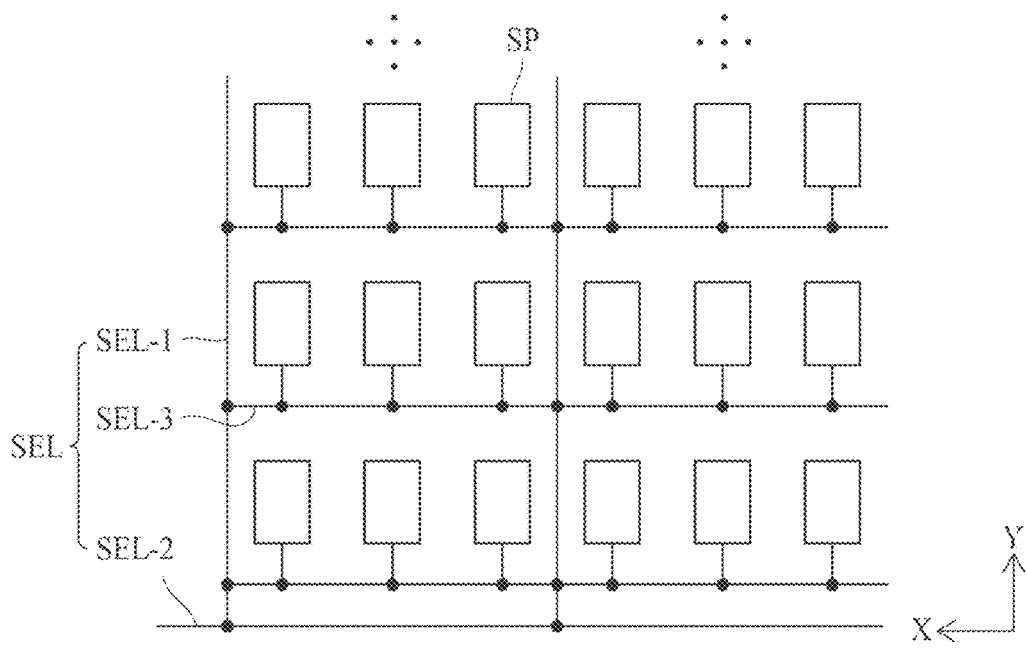
FIG. 9B is a diagram illustrating another example of a connection structure between one mode control line and sub-pixels.
Figure 10:
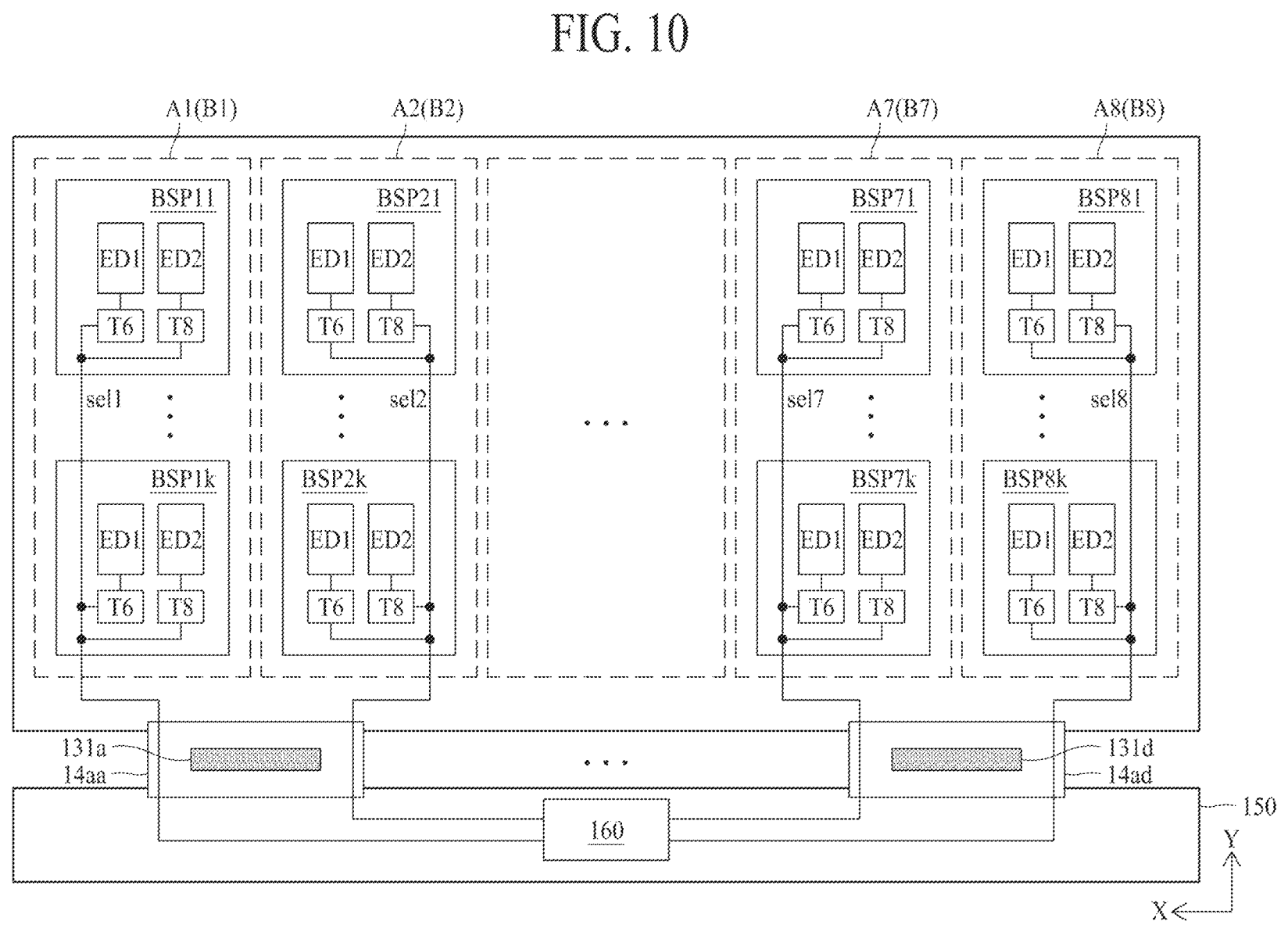

FIG. 8 is a diagram illustrating an example of a plurality of display areas independently controllable viewing angles in a display device according to one embodiment of the present disclosure. FIG. 9A is a diagram illustrating one example of a connection structure between one mode control line and sub-pixels, and FIG. 9B is a diagram illustrating another example of a connection structure between one mode control line and sub-pixels. FIG. 10 is a schematic illustration of a configuration of a display device according to one embodiment of the present disclosure and FIG. 11 is a diagram illustrating a driving method of a display device according to one embodiment of the present disclosure.

Figure 11:
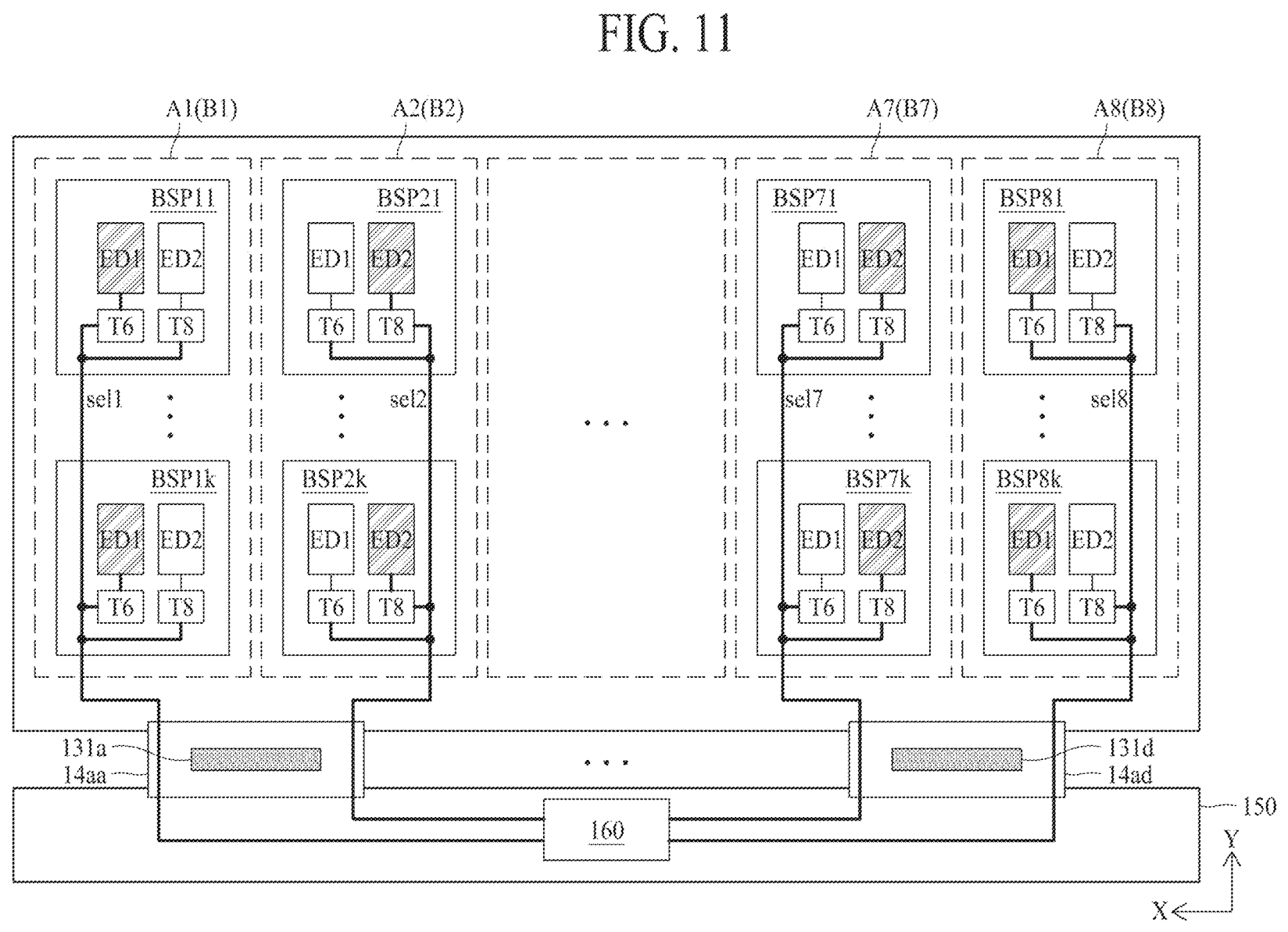

Referring now to FIGS. 8 to 11, the display panel 110 according to one embodiment of the present disclosure can be connected to a plurality of circuit films 140a to 140d on which the plurality of data driver ICs 131a to 131d are each mounted. The plurality of circuit films 140a-140d can be disposed in a row in the first direction (e.g., an X-axis direction), and can be bonded to a pad area provided in the non-display area NDA of the display panel 110. As shown in FIGS. 10 and 11, The plurality of circuit films 140a to 140d can be bonded to pad areas provided on the printed circuit substrate 150 on which the timing controller 160 is mounted, The display area DA of the display panel 110 can be divided into a plurality of display areas A1 to A8. The plurality of display areas A1 to A8 can be disposed in a direction parallel to the direction of arrangement of the plurality of circuit films 140a to 140d. For example, the plurality of display areas A1 to A8 can be disposed adjacent to each other in the first direction (e.g., first direction) or in a left-to-right direction.

One mode control line SEL can be disposed in each of the plurality of display areas A1 to A8. In the plurality of display areas A1 to A8, different mode control lines SEL are disposed and can independently control the viewing angle.

Since the display device 100 according to one embodiment of the present disclosure can select the viewing angle mode of the sub-pixel SP as the first viewing angle mode or the second viewing angle mode using one mode selection signal Sel, only one mode control line can be disposed in one display area. For example, the plurality of display areas A1 to A8 can correspond one-to-one to the plurality of mode control lines SEL1 to SEL8.

For example, as shown in FIG. 8, the display panel 110 can be divided into eight display areas A1 to A8. One mode control line SEL1-SEL8 can be disposed in each of the eight display areas A1-A8, and each of the mode control lines SEL1-SEL8 can be connected to one of the plurality of circuit films 140a-140d and be supplied with the mode selection signals sel1 to sel8. Each of the plurality of circuit films 140a-140d can be provided with at least two or more signal lines SL. Each of the two or more signal lines SL can be connected to different mode control lines SEL. In one example, as shown in FIG. 8, each of the plurality of circuit films 140a-140d can be provided with two signal lines SLs. The two signal lines SL can be connected to two mode control lines SEL, respectively. When the circuit films 140a-140d are four, the eight signal lines SL1-SL8 provided in the four circuit films 140a-140d can be connected to the eight mode control lines SEL1-SEL8, respectively.

In one example, a first mode control line SEL1 can be disposed in the first display area A1, and the first mode control line SEL1 can extend to the pad area included in the non-display area NDA to be connected to a first signal line SL1 of the first circuit film 140a. The first mode control line SEL1 can receive a first mode selection signal Sel1 for the first display area A1 from the timing controller 160 of the printed circuit substrate 150 through the first signal line SL1 of the first circuit film 140a.

A second mode control line SEL2 is disposed in the second display area A2, and the second mode control line SEL2 can extend to a pad area included in the non-display area NDA to be connected to a second signal line SL2 of the first circuit film 140a. The second mode control line SEL2 is separated from the first mode control line SEL1 and is not electrically connected to the first mode control line SEL 1. At this time, the second signal line SL2 can be separated without being electrically connected to the first signal line SL1. The second mode control line SEL2 can receive a second mode selection signal for the second display area A2 from the timing controller 160 of the printed circuit substrate 150 through the second signal line SL2 of the first circuit film 140a.

Since the first mode control line SEL1 disposed in the first display area A1 and the second mode control line SEL2 disposed in the second display area A2 are independently supplied with different mode selection signals SEL1 and SEL2, the first display area A1 and the second display area A2 can independently control the viewing angle.

On the other hand, the one mode control line SEL disposed in each of the display areas A1 to A8 can include lines electrically connected and supplied with the same mode selection signal.

In one embodiment, one mode control line SEL can include a plurality of first lines SEL-1 and second lines SEL-2, as shown in FIG. 9A. Each of the plurality of first lines SEL-1 can be disposed between sub-pixels SP within the display areas A1 to A8 corresponding to the corresponding mode control line SEL, and can extend in the second direction (e.g., in the Y-axis direction). Each of the plurality of first lines SEL-1 can extend to the non-display area NDA from the display areas A1 to A8 toward the circuit film 140.

As shown in FIG. 9A, the plurality of first lines SEL-1 can be provided in a number equal to the number of columns of sub-pixels SPs provided in the corresponding display areas A1 to A8. The first lines SEL-1 adjacent to each other can be spaced apart in the first direction (e.g., the X-axis direction) with one sub-pixel SP interposed therebetween. Each of the plurality of first lines SEL-1 can extend in the second direction (e.g., the Y-axis direction) and can be connected to the plurality of sub-pixels SPs arranged in the second direction (e.g., the Y-axis direction) to supply the mode selection signal.

The second line SEL-2 is disposed in the non-display area NDA and can connect the plurality of first lines SEL-1 extending to the non-display area NDA. As shown in FIG. 8, at least one end of the second line SEL-2 can extend toward the pad area and can be connected to a signal line SL of the circuit film 140. Since the second line SEL-2 can transmit the mode selection signal supplied through the signal line SL of the circuit film 140 to the plurality of first lines SEL-1, thereby supplying the mode selection signal to the sub-pixels SP connected to the plurality of first lines SEL-1 within the corresponding display areas A1 to A8. At this time, the same mode selection signal can be applied to the plurality of first lines SEL-1 and the second line SEL-2 included in one mode control line SEL.

In another embodiment, as shown in FIG. 9B, one mode control line SEL can include the plurality of first lines SEL-1, the second line SEL-2, and a plurality of third lines SEL-3. Each of the plurality of first lines SEL-1 can be disposed between sub-pixels SP within the display areas A1 to A8 corresponding to the corresponding mode control lines SEL, and can extend in the second direction (e.g., in the Y-axis direction). Each of the plurality of first lines SEL-1 can extend to the non-display area NDA from the display areas A1 to A8 toward the circuit film 140.

As shown in FIG. 9B, the plurality of first lines SEL-1 can include fewer than the number of columns of sub-pixels SPs provided in the corresponding display areas A1 to A8. The two first lines SEL-1 adjacent to each other can be spaced apart in the first direction (e.g., the X-axis direction) with the plurality of sub-pixels SPs interposed therebetween. Each of the plurality of first lines SEL-1 can extend in the second direction (e.g., the Y-axis direction) and can be connected to the plurality of sub-pixels SPs arranged in the second direction (e.g., the Y-axis direction) to supply the mode selection signal.

Each of the plurality of third lines SEL-3 can be disposed between the sub-pixels SP in the display areas A1 to A8 corresponding to the corresponding mode control line SEL, and can extend in the first direction (e.g., the X-axis direction). Each of the plurality of third lines SEL-3 can be extending in the first direction (e.g., the X-axis direction) and connected to the plurality of first lines SEL-1. Further, each of the plurality of third lines SEL-3 can be extending in the first direction (e.g., the X-axis direction) and connected to the plurality of sub-pixels SP arranged in the first direction (e.g., the X-axis direction) to supply a mode selection signal.

The second line SEL-2 is disposed in the non-display area NDA and can connect the plurality of first lines SEL-1 extending to the non-display area NDA. as shown in FIG. 8, at least one end of the second line SEL-2 can extend toward the pad area and can be connected to the signal line SL of the circuit film 140. The second line SEL-2 can supply the mode selection signals to the sub-pixels SP connected to the plurality of first lines SEL-1 and the plurality of third lines SEL-3 within the corresponding display areas A1 to A8 by transmitting the mode selection signals supplied through the signal lines SL of the circuit film 140 to the plurality of first lines SEL-1. At this time, the same mode selection signal can be applied to the plurality of first lines SEL-1, the second line SEL-2, and the plurality of third lines SEL-3 included in one mode control line SEL.

Meanwhile, As shown in FIGS. 10 and 11, each of the plurality of display areas A1 to A8 can include a pixel block B1 to B8 including sub-pixels connected to one mode control line SEL. Each of the plurality of pixel blocks B1 to B8 can be individually controlled by the mode selection signal applied through the mode control line SEL to selectively control to the first viewing angle mode (wide viewing angle mode or share mode) or the second viewing angle mode (narrow viewing angle mode or privacy mode).

Each of the plurality of pixel blocks B1 to B8 can include a plurality of sub-pixels BSPs. Each sub-pixel BSP can include the first emitting element ED1 whose emission is controlled by the first control transistor T6 of the pixel circuit, and the second emitting element ED2 whose emission is controlled by the second control transistor T8.

The first and second control transistors T6 and T8 can be controlled by the mode select signal Sel supplied through the mode control line SEL. The mode control line SEL can supply any one of the first gate-on-voltage VON1 and the second gate-on-voltage VON2 as the mode selection signal Sel. When the mode selection signal Sel is the first gate-on-voltage VON1, the first control transistor T6 can be turned on, and the second control transistor T8 can be turned off. On the other hand, when the mode selection signal Sel is the second gate-on-voltage VON2, the first control transistor T6 can be turned off, and the second control transistor T8 can be turned on.

In one embodiment, when the first control transistor T6 is a P-type and the second control transistor T8 is an N-type, the first gate-on-voltage VON1 can be expressed as a low voltage and the second gate-on-voltage VON2 can be expressed as a high voltage.

In another embodiment, when the first control transistor T6 is an N-type and the second control transistor T8 is a P-type, the first gate-on-voltage VON1 can be expressed as a high voltage and the second gate-on-voltage VON2 can be expressed as a low voltage.

In one embodiment, as shown in FIGS. 10 and 11, the plurality of mode selection signals for each of the plurality of mode control lines SEL1 to SEL8 can be supplied from the timing controller 160 through the signal lines SL1 to SL8 of the printed circuit substrate 150 and circuit film 140. However, it is not necessarily limited thereto.

In another embodiment, the plurality of mode selection signals for each of the plurality of mode control lines SEL1 to SEL8 can be supplied from one of the data driver ICs 131a to 131d through signal lines SL1 to SL8 of the circuit film 140.

Each of the plurality of mode control lines SEL1 to SEL8 can individually receive the mode selection signal Sel from the timing controller 160 or the data drive ICs 131a to 131d. Accordingly, the display panel 110 can independently control the viewing angles of the plurality of pixel blocks B1 to B8.

As described as an example, the first mode control line SEL1 can be supplied with the first mode selection signal Sel1 from the timing controller 160 or the data drive IC 131a. The first mode control line SEL1 is disposed in the first display area A1, and by delivering the first mode selection signal Sel1 to the sub-pixels BSP11 to BSP1k provided in the first pixel block B1, the viewing angle mode of the first pixel block B1 can be controlled.

The second mode control line SEL2 can be supplied with the second mode selection signal Sel2 from the timing controller 160 or the data driver IC 131a. The second mode control line SEL2 is disposed in the second display area A2, and by delivering the second mode selection signal Sel2 to the sub-pixels BSP21 to BSP2k provided in the second pixel block B2, the viewing angle mode of the second pixel block B2 can be controlled.

As shown in FIG. 11, the first mode control line SEL1 can be supplied with the first gate-on-voltage VON1 as the first mode selection signal Sel1. Accordingly, in the sub-pixels BSP11 to BSP1k included in the first pixel block B1, the first emitting element ED1 can emit through the first control transistor T6 in response to the first mode selection signal Sel1 activated by the first gate-on-voltage VON1. The light emitted from the first emitting element ED1 can emit at a wide viewing angle.

The second mode control line SEL2 can be supplied with the second gate-on-voltage VON2 as the second mode selection signal Sel2. Accordingly, in the sub-pixels BSP21 to BSP2k included in the second pixel block B2, the second emitting element ED2 can emit light through the second control transistor T8 in response to the second mode selection signal sel2 activated by the second gate-on-voltage VON2. The light emitted from the second emitting element ED2 can emit at a narrow viewing angle.

Accordingly, the first display area A1 including the first pixel block B1 can display the image in the wide viewing angle mode, and the second display area A2 including the second pixel block B2 can display the image in the narrow viewing angle mode.

The display device 100 according to one embodiment of the present disclosure can utilize only one mode control line SEL to control the viewing angle mode of the sub-pixels BSPs included in the one pixel block B1-B2. The display device 100 according to one embodiment of the present disclosure can significantly reduce the number of mode control lines SEL disposed in the display device 100 when compared to a display device having a control line for selecting the first viewing angle mode and a control line for selecting the second viewing angle mode, respectively.

In the display device 100 according to one embodiment of the present disclosure, the mode control lines SEL can be disposed within the pad area of the display panel 110 as the number of mode control lines SEL is reduced, thus the number of pads in connection with the mode control lines SEL can also be reduced. The display device 100 according to one embodiment of the present disclosure can reduce the area of the pad area, and further, the area of the non-display area NDA (bezel area) can be reduced. In other words, the display device 100 according to one embodiment of the present disclosure can implement a narrow bezel.

In addition, the display device 100 according to one embodiment of the present disclosure can reduce the number of signal lines SL connected to the mode control lines SEL through pads on each of the plurality of circuit films 140a to 140d as the number of mode control lines SEL is reduced. The width of the plurality of circuit films 140a to 140d can be increased in order to dispose many signal lines SL within a limited space as the number of signal lines SL increases. As the width of the plurality of circuit films 140a to 140d increases, the area of the non-display area NDA to which the plurality of circuit films 140a to 140d are connected also increases, thereby increasing the bezel area of the display panel 110. The display device 100 according to one embodiment of the present disclosure can reduce the number of signal lines SL disposed on the plurality of circuit films 140a to 140d and prevent the width of the plurality of circuit films 140a-140d from decreasing or increasing.

Figure 12:
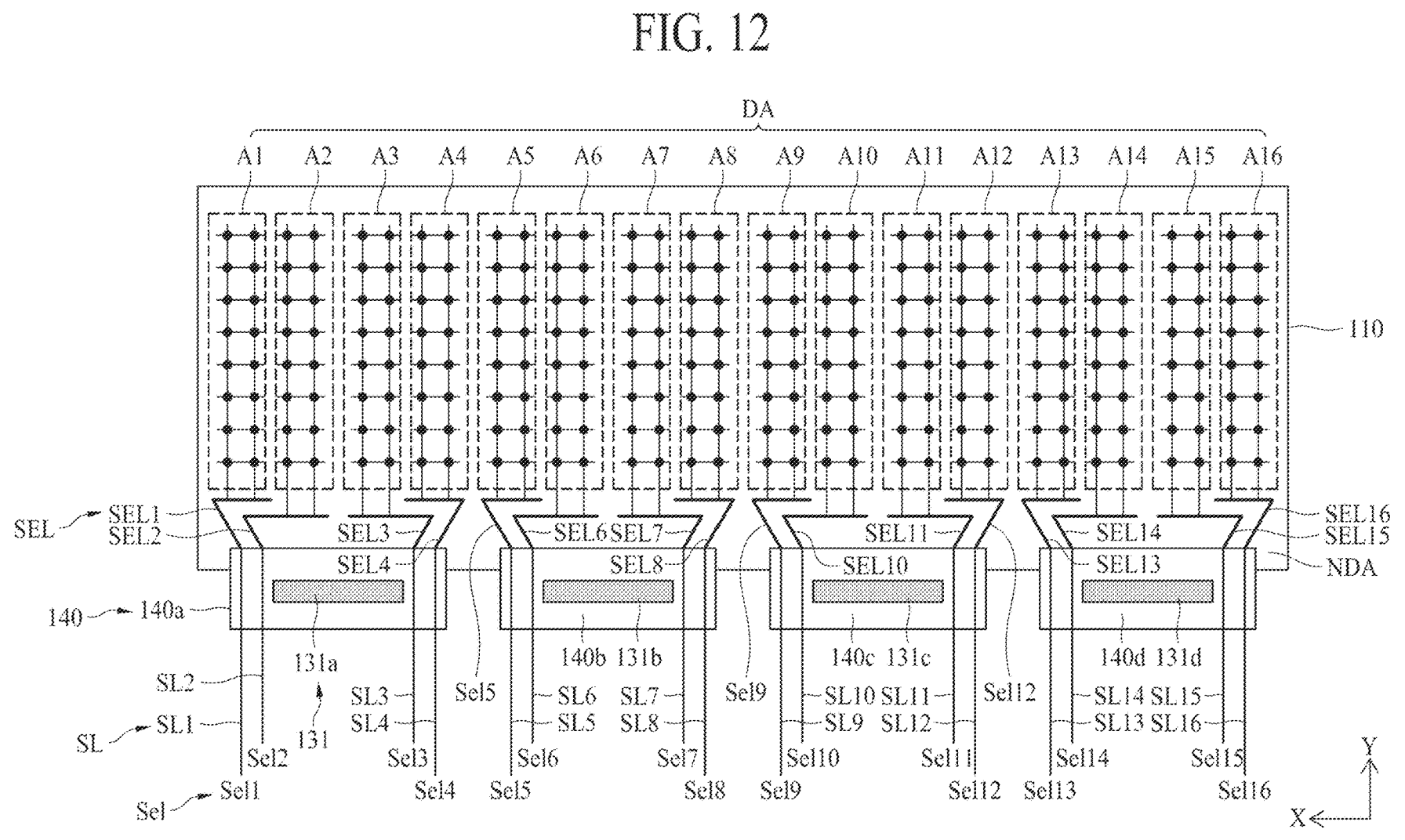

FIG. 12 is a diagram illustrating another example of a plurality of display areas independently controllable viewing angles in a display device according to one embodiment of the present disclosure.

The display device 100 illustrated in FIG. 12 can increase the number of divided display areas compared to FIG. 8.

Referring to FIG. 12, each of the plurality of circuit films 140a to 140d can be provided with four signal lines SL, and the four signal lines SL can be respectively connected with four mode control lines SEL. When there are four circuit films 140a to 140d, 16 signal lines SL1 to SL16 provided in the four circuit films 140a to 140d can be connected with 16 mode control lines SEL1 to SEL16, respectively.

Since the display device 100 according to one embodiment of the present disclosure can select a viewing angle mode of the sub-pixel SP as the first viewing angle mode or the second viewing angle mode using one mode selection signal Sel, one mode control line SEL can be disposed in one display area. Accordingly, the 16 mode control lines SEL1 to SEL16 can be disposed one to one in the 16 display areas A1 to A16.

The display device 100 according to one embodiment of the present disclosure can have an increased number of display areas A1 to A16 divided so that the viewing angle within the display device 100 can be controlled independently when compared to a display device having a control line for selecting the first viewing angle mode and the control line for selecting a second viewing angle mode, respectively.

A display device having a control line for selecting the first viewing angle mode and a control line for selecting the second viewing angle mode, respectively, requires four mode control lines SEL to independently control the viewing angle modes of the two display areas A1-A2. When the circuit films 140a to 140d are provided with four signal lines SL, the four mode control lines SEL can be connected to the signal lines of one circuit film 140a. In other words, the display device having a control line for selecting the first viewing angle mode and a control line for selecting the second viewing angle mode can independently control the viewing angle modes of the two display areas A1 to A2 using the signals supplied through the one circuit film 140a.

On the other hand, the display device 100 according to one embodiment of the present disclosure can utilize one mode control line SEL to control the viewing angle mode of one display area. Accordingly, the display device 100 according to one embodiment of the present disclosure can utilize four mode control lines SEL to independently control the viewing angle modes of the four display areas A1 to A4. In other words, the display device 100 according to one embodiment of the present disclosure can independently control the viewing angle modes of the four display areas A1 to A4 using signals supplied through the one circuit film 140a.

As a result, the display device 100 according to one embodiment of the present disclosure can increase the number of display areas A1 to A16 whose viewing angles can be independently controlled within the display panel 110. The display device 100 according to one embodiment of the present disclosure can precisely control of the viewing angle within the display area DA.

Figure 13:
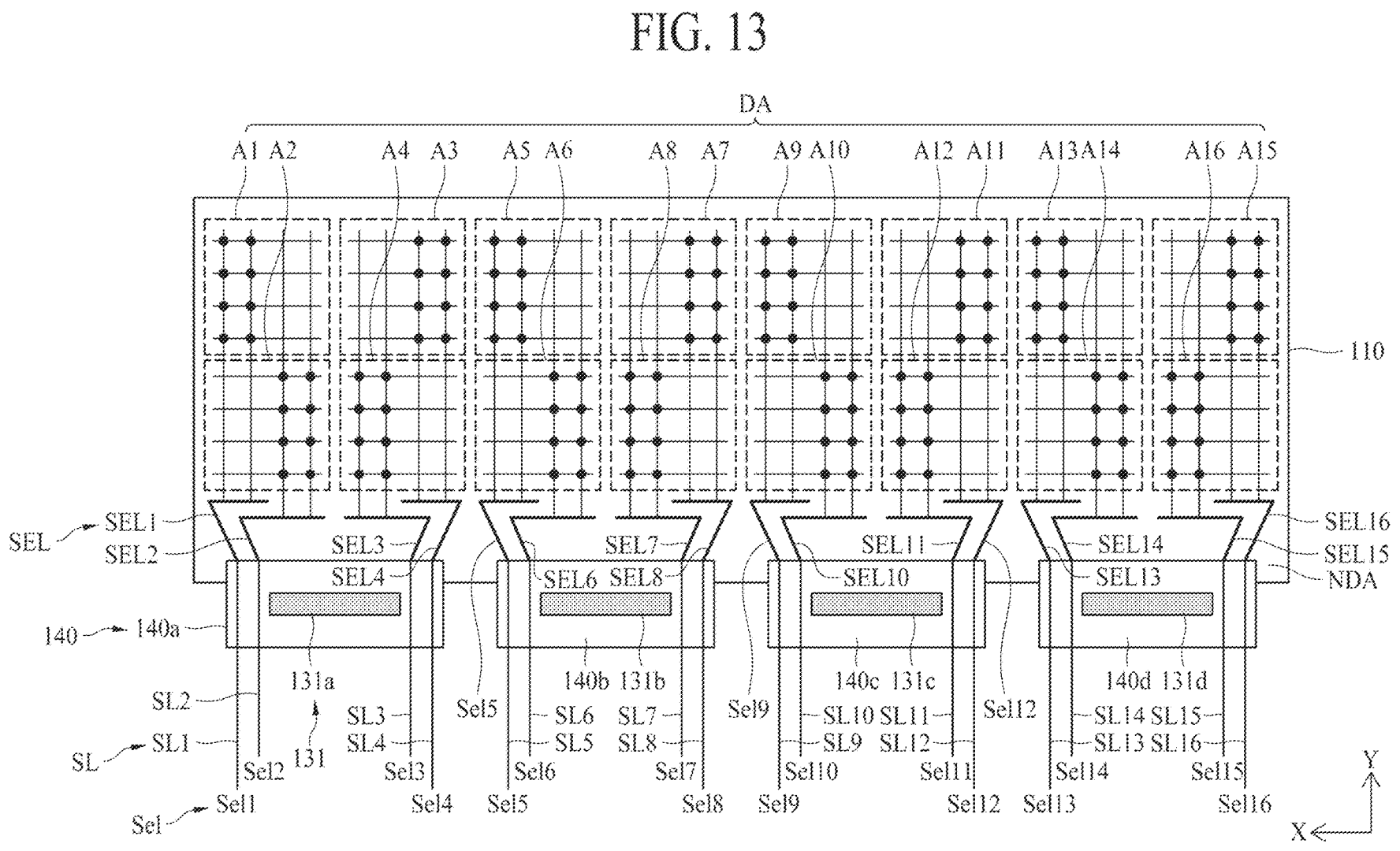

FIG. 13 is a diagram illustrating another example of a plurality of display areas independently controllable viewing angles in a display device according to one embodiment of the present disclosure.

The display device 100 illustrated in FIG. 13 can have a different arrangement of the divided display areas A1 to A8 compared to FIG. 8.

Referring to FIG. 13, the display area DA of the display panel 110 can be divided into a plurality of display areas A1 to A8. The plurality of display areas A1 to A8 can be disposed in a direction perpendicular to the direction of arrangement of the plurality of circuit films 140a to 140d. For example, the plurality of display areas A1 to A8 can be disposed adjacent to each other in the second direction (e.g., the second direction) or an up-down direction.

The display device 100 according to one embodiment of the present disclosure can freely divide the display areas A1 to A8, the viewing angles of which are independently controllable within the display panel 110. The display device 100 according to one embodiment of the present disclosure can have an increased degree of design freedom as the number of mode control lines SEL disposed in the display panel 110 decreases. The display device 100 according to one embodiment of the present disclosure can divide the display areas A1 to A8 in a left-to-right direction, an up-down direction, or a combination of these directions, as desired.

Figure 14:
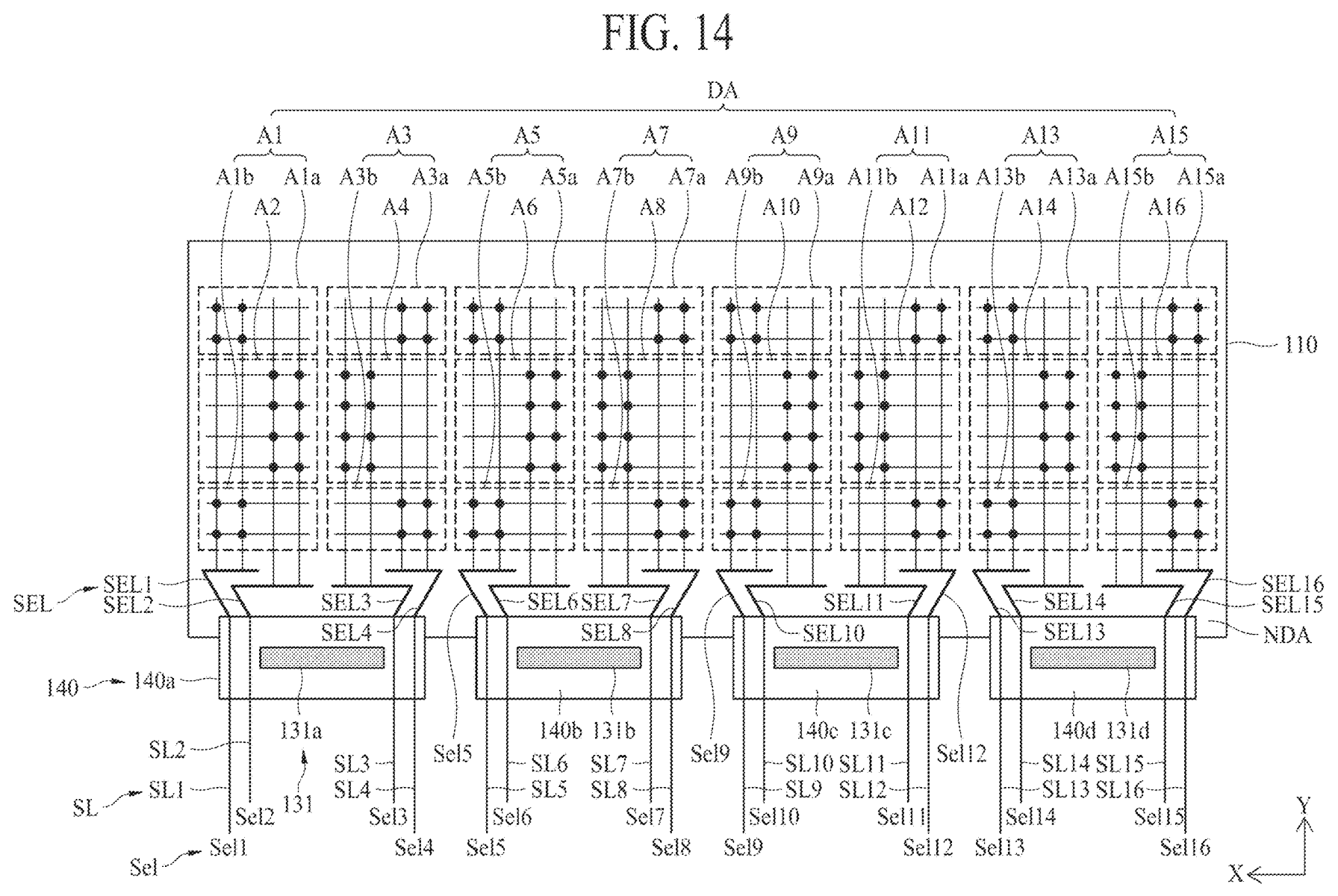

FIG. 14 is a diagram illustrating another example of a plurality of display areas independently controllable viewing angles in a display device according to one embodiment of the present disclosure.

The display device 100 illustrated in FIG. 14 can have a different arrangement of the divided display areas A1 to A8 compared to FIG. 8.

Referring to FIG. 14, the display area DA of the display panel 110 can be divided into a middle area and an upper and lower area. Specifically, the display area DA of the display panel 110 can be divided into a plurality of intermediate display areas A2, A4, A6, A8, A10, A12, A14, and A16 disposed in the intermediate area and a plurality of upper and lower display areas A1, A3, A5, A7, A9, A11, A13, and A15 with the intermediate display areas interposed therebetween. Each of the plurality of upper and lower display areas A1, A3, A5, A7, A9, A11, A13, and A15 can include a first sub-area A1*a*, A3*a*, A5*a*, A7*a*, A9*a*, A11*a*, A13*a*, and A15*a* disposed on one side, e.g., a upper side, of one of the plurality of intermediate display areas A2, A4, A6, A8, A10, A12, A14, and A16. Each of the plurality of upper and lower display areas A1, A3, A5, A7, A9, A11, A13, and A15 can further include a second sub-area A1*b*, A3*b*, A5*b*, A7*b*, A9*b*, A11*b*, A13*b*, and A15*b* disposed on other side, e.g., a lower side, of one of the plurality of intermediate display areas A2, A4, A6, A8, A10, A12, A14, and A16.

The same mode control line SEL can be disposed in the first sub-area A1*a*, A3*a*, A5*a*, A7*a*, A9*a*, A11*a*, A13*a*, and A15*a* and the second sub-area A1*b*, A3*b*, A5*b*, A7*b*, A9*b*, A11*b*, A13*b*, and A15*b* included in the same upper and lower display area A1, A3, A5, A7, A9, A11, A13, and A15. For example, the first display area A1 can be an upper and lower display area disposed above and below with the second display area A2 interposed therebetween. The first display area A1 can include a first sub-area A1*a* disposed on an upper side of the second display area A2 and a second sub-area A1*b* disposed on a lower side of the second display area A2. The first mode control line SEL1 can be disposed in the first display area A1. At least one end of the first mode control line SEL1 can be connected to the circuit film 140*a* and can be extended from the circuit film 140*a* to the second sub-area A1*b* disposed adjacent to the circuit film 140*a* and be disposed in the second sub-area A1*b*. Furthermore, the first mode control line SEL1 can be extended further from the second sub-area A1*b* toward the first sub-area A1*a* and be disposed in the first sub-area A1*a* as well. The first mode control line SEL1 can be connected to the sub-pixels disposed in the first sub-area A1*a* and the second sub-area A1*b* of the first display area A1 to supply the first mode selection signal Sel1.

Meanwhile, the second display area A2 can be an intermediate display area disposed between the first sub-area A1*a* and the second sub-area A1*b* of the first display area A1. The second mode control line SEL2 can be disposed in the second display area A2. At least one end of the second mode control line SEL2 can be connected to the circuit film 140*a* and can be extended from the circuit film 140*a* to the second display area A2 and be disposed in the second display area A2. The second mode control line SEL2 can be connected to the sub-pixels disposed in the second display area A2 to supply the second mode selection signal Sel2.

The display device 100 according to one embodiment of the present disclosure can independently control the viewing angle mode of the intermediate display area and the upper and lower display areas. Generally, the image information displayed on the screen can include important contents in the intermediate display area. The display device 100 according to one embodiment of the present disclosure can independently control the viewing angles of the intermediate display area and the upper and lower display areas by dividing the display area into the intermediate display area and the upper and lower display areas in consideration of the pattern in which the image information is displayed, thus the image information displayed in the intermediate area is not exposed to a third party. Accordingly, the display device 100 according to one embodiment of the present disclosure can efficiently perform security management for the image information displayed on the display panel 110.

In the present disclosure, by utilizing only one mode control line to select the viewing angle mode of the sub-pixel between the first viewing angle mode and the second viewing angle mode, the number of mode control lines disposed on the display panel can be significantly reduced.

In the present disclosure, since the number of signal lines disposed within the display panel can be reduced, the production energy and the generation of greenhouse gases can be reduced, thereby implementing ESG (Environment/Social/Governance).

In the present disclosure, since the number of pads disposed in the pad area of the display panel and connected to the mode control lines is reduced, the area of the pad area can be reduced, and further, the area of the bezel area can be reduced.

In the present disclosure, since the number of display areas in which viewing angles are independently controlled can be increased in the display panel, the viewing angles within the display area can be more precisely controlled.

In the present disclosure, the number of mode control lines disposed on the display panel can be decreased, thereby increasing the degree of freedom of design. In addition, in the present disclosure, the display areas can be divided in a left-to-right direction, an up-down direction, or a combination of these directions, as desired.

The effects to be obtained from the present disclosure are not limited to those mentioned above, and other effects not mentioned will be apparent to one having ordinary skill in the art to which the present invention belongs from the following description.

Embodiments of the present disclosure have been described in more detail with reference to the accompanying drawings, but the present disclosure is not necessarily limited to these embodiments and can be practiced in various modifications without departing from the technical ideas of the present disclosure. Accordingly, the embodiments disclosed herein are intended to illustrate and not to limit the technical ideas of the present disclosure, and the scope of the technical ideas of the present disclosure is not limited by these embodiments. Therefore, the embodiments described above are exemplary in all respects and should be understood as non-limiting. The scope of protection of this disclosure shall be construed by the claims, and all technical ideas within the scope of the claims shall be construed to be included within the scope of the claims.

What is claimed is:

1. A display device comprising:
a first mode sub-pixel having a first viewing angle and including a first emitting element;
a second mode sub-pixel having a second viewing angle and including a second emitting element;
a driving transistor connected to the first emitting element or the second emitting element;
a first control transistor configured to connect the first emitting element to the driving transistor by being controlled by a mode selecting signal;

25 a second control transistor configured to connect the second emitting element to the driving transistor by being controlled by the mode selecting signal; and a mode control line configured to apply the mode selection signal to the first switching transistor and the second switching transistor, wherein the first control transistor and the second control transistor are applied with the mode selection signal from the same mode control line, and wherein the first control transistor is configured to be turned on by the mode selection signal corresponding to a first voltage, and the second control transistor is configured to be turned on by the mode selection signal corresponding to a second voltage different from the first voltage.

2. The display device of claim 1, wherein the first viewing angle and the second viewing angle are different in at least one of a direction and an angular range.

3. The display device of claim 1, wherein the second mode sub-pixel is disposed adjacent to the first mode sub-pixel.

4. The display device of claim 1, wherein only one of the first control transistor and the second control transistor is turned on when the mode selection signal is applied to the first control transistor and the second control transistor.

5. The display device of claim 1, wherein one of the first voltage and the second voltage is a high voltage and the other of the first voltage and the second voltage is a low voltage.

6. The display device of claim 1, wherein one of the first control transistor and the second control transistor is a N-type transistor and the other of the first control transistor and the second control transistor is a P-type transistor.

7. The display device of claim 1, further comprising:

a timing controller configured to supply the mode selection signal to the mode control line.

8. The display device of claim 1, further comprising:

a pixel block provided with a plurality of sub-pixels comprising the first mode sub-pixel and the second mode sub-pixel, wherein the plurality of sub-pixels included in the pixel block are applied with the mode selection signal from the same mode control line.

9. The display device of claim 8, wherein the pixel block is provided to be plural, and wherein the mode control line is provided to be plural and is disposed in each of the pixel blocks.

10. The display device of claim 9, wherein the mode control lines correspond one-to-one with the pixel blocks.

11. A display device comprising:

a display panel comprising a plurality of display areas, a pad area, and a plurality of mode control lines disposed in each of the plurality of display areas to extend to the pad area, the plurality of display areas having a plurality of sub-pixels respectively, wherein the plurality of mode control lines correspond one-to-one to the plurality of display areas, and wherein each of the plurality of mode control lines applies a mode selection signal to the plurality of sub-pixels provided in the corresponding display area.

12. The display device of claim 11, wherein each of the plurality of sub-pixels comprises:

a first mode sub-pixel having a first viewing angle and comprising a first emitting element, and a second mode sub-pixel having a second viewing angle smaller than the first viewing angle and comprising a second emitting element,

wherein one of the first mode sub-pixel and the second mode sub-pixel selectively emits according to the mode selection signal.

13. The display device of claim 12, wherein the first mode sub-pixel and the second mode sub-pixel, which are comprised in a same sub-pixel, are applied with the mode selection signal from the same mode control line.

14. The display device of claim 12, wherein the display panel further comprises:

a driving transistor connected to the first emitting element or the second emitting element, a first control transistor configured to connect the first emitting element to the driving transistor by being controlled by the mode selecting signal, and a second control transistor configured to connect the second emitting element to the driving transistor by being controlled by the mode selecting signal, wherein the first control transistor is turned on while the second control transistor is turned off, when the mode selection signal corresponding to a first gate-on-voltage is supplied to the mode control line, and wherein the first control transistor is turned off while the second control transistor is turned on, when the mode selection signal corresponding to a second gate-on-voltage is supplied to the mode control line.

15. The display device of claim 11, further comprising:

a circuit film on which a data drive integrated circuit (IC) is mounted, the circuit film comprising a plurality of signal lines connected to each of the plurality of mode control lines in the pad area of the display panel, and a printed circuit board connected to the circuit film, wherein a timing controller is mounted on the printed circuit board, wherein each of the plurality of mode control lines is supplied with the mode selection signal through the signal lines of the circuit film from the data drive IC or the timing controller.

16. The display device of claim 15, wherein the circuit film is provided to be plural in a first direction, wherein each circuit film is provided with signal lines for controlling the modes of at least two display areas, and wherein the at least two display areas are disposed adjacent to each other in the first direction.

17. The display device of claim 16, wherein the at least two display areas comprise a first display area and a second display area, and wherein the second display area comprises a first sub-area disposed in one side of the first display area and a second sub-area disposed in another side of the first display area.

18. The display device of claim 11, wherein each of the plurality of mode control lines comprises:

a plurality of first lines extended in a first direction within the corresponding display area, and one second line connecting the plurality of the first lines and extended to the pad area, wherein the same mode selection signal is applied to the plurality of first lines and the second line.

19. The display device of claim 18, further comprising:

a plurality of third lines extended in a second direction within the corresponding display area and be connected to the plurality of first lines, the second direction being different from the first direction, wherein the plurality of first lines, the second line, and the plurality of third lines are supplied with the same mode selection signal.

* * * * *